(12) United States Patent
Kawahito et al.

(10) Patent No.: US 8,558,293 B2
(45) Date of Patent: Oct. 15, 2013

(54) SEMICONDUCTOR ELEMENT AND SOLID-STATE IMAGING DEVICE

(75) Inventors: Shoji Kawahito, Hamamatsu (JP); Keita Yasutomi, Hamamatsu (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 0 days.

(21) Appl. No.: 13/501,017

(22) PCT Filed: Oct. 7, 2010

(86) PCT No.: PCT/JP2010/067672
§ 371 (c)(1),
(2), (4) Date: Apr. 9, 2012

(87) PCT Pub. No.: WO2011/043432
PCT Pub. Date: Apr. 14, 2011

(65) Prior Publication Data
US 2012/0193692 A1    Aug. 2, 2012

(30) Foreign Application Priority Data
Oct. 9, 2009   (JP) ................................ 2009-235208

(51) Int. Cl.
*H01L 31/0224*    (2006.01)
(52) U.S. Cl.
USPC .................................. 257/292; 257/E31.124
(58) Field of Classification Search
USPC ......................................... 257/292, E31.124
See application file for complete search history.

(56) References Cited

U.S. PATENT DOCUMENTS

| | | | |
|---|---|---|---|
| 5,986,297 A | 11/1999 | Guidash et al. | |
| 7,361,877 B2 | 4/2008 | McGrath et al. | |
| 2005/0168604 A1 | 8/2005 | Mishina et al. | |
| 2008/0142856 A1 | 6/2008 | Sato et al. | |
| 2011/0298079 A1 | 12/2011 | Kawahito | |

FOREIGN PATENT DOCUMENTS

| | | |
|---|---|---|
| JP | 2004 111590 | 4/2004 |
| JP | 2005 217302 | 8/2005 |
| JP | 2005 223134 | 8/2005 |
| JP | 2005-295346 A | 10/2005 |
| JP | 2008 103647 | 5/2008 |
| JP | 2008 108916 | 5/2008 |
| JP | 2008-252695 A | 10/2008 |

OTHER PUBLICATIONS

International Search Report Issued Dec. 14, 2010 in PCT/JP10/67672 Filed Oct. 7, 2010.
English Translation of International Preliminary Report on Patentability (Chapter II of the PCT : PCT/IB/338, PCT/IPEA/409) issued on May 18, 2012 in PCT/JP2010/067672 filed on Oct. 7, 2010.
U.S. Appl. No. 13/500,331, filed Apr. 5, 2012, Kawahito, et al.

*Primary Examiner* — Long Pham
(74) *Attorney, Agent, or Firm* — Oblon, Spivak, McClelland, Maier & Neustadt, L.L.P.

(57) ABSTRACT

A semiconductor element includes a base-body region of p-type; a charge-generation buried region of a n-type, implementing a photodiode together with the base-body region, configured to create a first potential valley in the base-body region; an accumulation region of n-type, being buried in a part of the upper portion of the base-body region, configured to create a second potential valley deeper than the first potential valley; a transfer-gate insulation film provided on a surface of the base-body region; a transfer-gate electrode provided on the transfer-gate insulation film, configured to control a potential of a transfer channel formed in the base-body region between the charge-generation buried region and the accumulation region; and a recessed-potential creation mechanism configured to create a stair-like-shaped potential barrier for electronic shuttering.

14 Claims, 13 Drawing Sheets

(a)

(b)

(c)

(d)

(e)

(a)

(b)

(c)

(a)

(b)

(c)

(a)

(b)

(a)

(b)

SEMICONDUCTOR ELEMENT AND SOLID-STATE IMAGING DEVICE

TECHNICAL FIELD

The present invention relates to a semiconductor element that has a function for transferring and accumulating electrons generated by light, and a solid-state imaging device in which the semiconductor elements are periodically arrayed one-dimensionally or two-dimensionally.

BACKGROUND ART

In CMOS image sensors, although a rolling shutter operation is basic architecture, a CMOS image sensor that has a function of global electronic shuttering (whole-pixel-simultaneous electronic shuttering) and reset-noise removing is proposed (see patent literature (PTL) 1). As the CMOS image sensor that has the above whole-pixel-simultaneous electronic shuttering function, in PTL 1, a part of the CMOS image sensor is implemented by CCD structure, and in order to hold charges, the realization of lower dark current characteristic is tried with CMOS capacitors of buried configuration.

Alternatively, CMOS image sensors that hold charges by using accumulation diodes of buried configuration, without using the CCD structure are proposed (see PTLs 2 and 3). In the CMOS image sensor disclosed in PTL 2, charges are transferred by using a depletion potential difference generated by changing n-type doping concentrations of photodiode and the accumulation diode. In the CMOS image sensor disclosed in PTL 3, by controlling shuttering gate, charges are shared in the two diodes of photodiode and the accumulation diode, and a part of charges generated in the photodiode is moved to the accumulation diode, and consequently, the electronic-shuttering operation is carried out, even if there is no difference of the depletion potential as the photodiode and the accumulation diode have the same doping concentration.

CITATION LIST

Patent Literature

PTL 1: JP 2004-111590A
PTL 2: JP 2008-103647A
PTL 3: U.S. Pat. No. 7,361,877B

SUMMARY OF INVENTION

Technical Problem

However, in PTL 1, since only n-type buried region under the gate is used to accumulate charges, the impurity concentration is required to be sufficiently high. Moreover, in order to fill the surface with holes and decrease dark current through pinning, a large negative voltage must be applied to the gate. It is not easy to generate the large negative voltage. Also, in PTLs 2, 3, in order to perfectly transfer charges to the accumulation diode from the photodiode, the difference between the depletion potential (potential well) of two buried diodes is required to be large, and in order to prepare the sufficient capacitance of the accumulation diode, a high power supply voltage is required. Moreover, in PTL 3, because p-type doping is carried out to cover the accumulation diode, a potential barrier is created, and perfect transfer of charges from the photodiode to the accumulation diode is difficult. In PTL 3, charges generated in the photodiode are shared together with the accumulation diode, and a part of charges moved to the accumulation diode is used to achieve the electronic shuttering function. Hence, as a part of charges generated by light is left in the photodiode, and extracted to a drain, the sensitivity of the CMOS image sensor is decreased.

An object of the present invention is to provide a semiconductor element in which, even if a potential difference between potential valleys created on both sides of a transfer gate is small, it is possible to achieve the perfect transfer of charges and it is possible to store a sufficient accumulation charges, and a solid-state imaging device in which the semiconductor element is used as a sensor element (pixel).

Solution to Problem

In order to achieve the above object, a first aspect of the present invention inheres in a semiconductor element encompasses (a) a base-body region implemented by a semiconductor of a first conductivity type; (b) a charge-generation buried region of a second conductivity type, being buried in a part of an upper portion of the base-body region so as to implement a photodiode together with the base-body region, configured to create a first potential valley in the base-body region; (c) an accumulation region of the second conductivity type, being buried in a part of the upper portion of the base-body region, separately from the charge-generation buried region, configured to create a second potential valley deeper than the first potential valley, where direction of field toward which signal charges generated by the photodiode move is defined as depth direction; (d) a transfer-gate insulation film provided on a surface of the base-body region between the charge-generation buried region and the accumulation region; (e) a transfer-gate electrode provided on the transfer-gate insulation film, configured to control a potential of a transfer channel formed in the base-body region between the charge-generation buried region and the accumulation region; and (f) a recessed-potential creation means configured to create a stair-like-shaped potential barrier for electronic shuttering, the stair-like-shaped potential barrier has a shoulder level at a side of the second potential valley, the shoulder level is lower by one stage in a potential barrier reduction direction than top level of the first potential valley, between the first potential valley and the second potential valley. In the semiconductor element pertaining to the first aspect, while a qualitative level relation between the top level and the shoulder level is kept, a height of the top level of electronic-shuttering potential barrier is changed by voltages applied to the transfer-gate electrode, and the signal charges are transferred from the charge-generation buried region to the accumulation region.

A second aspect of the present invention inheres in a solid-state imaging device comprising a plurality of pixels being arrayed, each of the pixels encompasses (a) a base-body region implemented by a semiconductor of a first conductivity type; (b) a charge-generation buried region of a second conductivity type, being buried in a part of an upper portion of the base-body region so as to implement a photodiode together with the base-body region, configured to create a first potential valley in the base-body region; (c) an accumulation region of the second conductivity type, being buried in a part of the upper portion of the base-body region, separately from the charge-generation buried region, configured to create a second potential valley deeper than the first potential valley, where direction of field toward which signal charges generated by the photodiode move is defined as depth direction; (d) a transfer-gate insulation film provided on a surface of the base-body region between the charge-generation buried region and the accumulation region; (e) a transfer-gate electrode provided on the transfer-gate insulation film, configured to control a potential of a transfer channel formed in the base-body region between the charge-generation buried region and the accumulation region; and (f) a recessed-potential creation means configured to create a stair-like-shaped potential barrier for electronic shuttering, the stair-like-shaped potential barrier has a shoulder level at a side of the second potential valley, the shoulder level is lower by one stage in a potential barrier reduction direction than top level of the first potential valley, between the first potential valley and the second potential valley. In the solid-state imaging device pertaining to the second aspect, by applying simultaneously a voltage to the transfer-gate electrodes in each of pixels, keeping a qualitative level relation between the top level and the shoulder level, a height of the top level of electronic-shuttering potential barrier is changed by voltages applied to the transfer-gate electrode in each of pixels, and the signal charges are transferred respectively from the charge-generation buried region to the accumulation region in each of pixels, and thereby global electronic shuttering is executed.

Advantageous Effects of Invention

According to the present invention, it is possible to provide a semiconductor element in which, even if the potential difference between the potential valleys created on both sides of the transfer gate is small, it is possible to achieve the perfect transfer of charges and it is possible to store the sufficient number of the accumulation charges, and a solid-state imaging device in which the semiconductor element is used as the sensor element (pixel)

BRIEF DESCRIPTION OF DRAWINGS

FIG. 2 (b) is a potential diagram for signal charges (electrons) that corresponds to FIG. 2 (a) in which a lower direction is represented as a positive direction of potential.

FIG. 2 (c) is a potential diagram describing a manner when the signal charges (electrons) are transferred.

FIG. 3 (e) is a potential diagram describing the manner when the signal charges (electrons) are transferred, in which the lower direction is defined as the positive direction.

FIG. 7 (b) is a potential diagram for signal charges (electrons) that corresponds to FIG. 7 (a), in which a lower direction is represented as a positive direction of potential.

FIG. 8 (b) is a potential diagram corresponding to FIG. 8 (a) in which a lower direction is represented as a positive direction of potential.

FIG. 8 (c) is a potential diagram describing a manner when signal charges (electrons) are extracted, in which the lower direction is represented as the positive direction.

FIG. 10 (b) is a potential diagram in a horizontal direction when a different voltage as control signal is applied to a transfer-gate electrode, in the semiconductor element illustrated in FIG. 10 (a).

FIG. 10 (c) is a potential diagram in a depth direction of a substrate when the different voltage as the control signal is applied to the transfer-gate electrode, in the semiconductor element illustrated in FIG. 10 (a).

FIG. 11 (b) is a potential diagram for signal charges (electrons) that corresponds to FIG. 11 (a), in which a lower direction is represented as a positive direction of potential.

FIG. 12 (b) is a potential diagram for signal charges (electrons) that corresponds to FIG. 12 (a), in which a lower direction is represented as a positive direction of potential.

FIG. 13 (b) is a potential diagram for signal charges (electrons) that corresponds to FIG. 13 (a), in which a lower direction is represented as a positive direction of potential.

DESCRIPTION OF EMBODIMENTS

Figure 1:
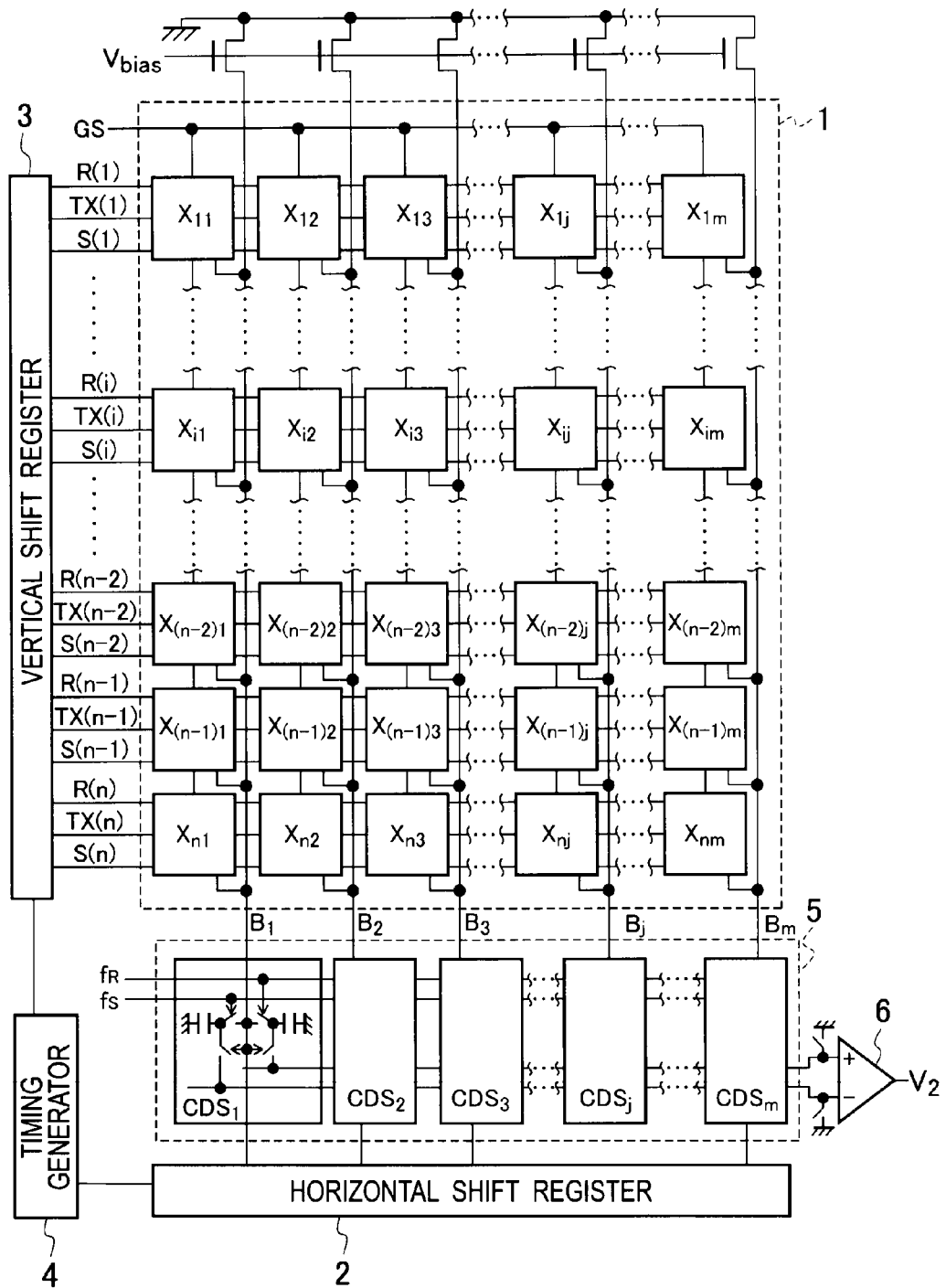
FIG. 1 is a schematic plan view describing a layout on a semiconductor chip of a solid-state imaging device (two-dimensional image sensor) pertaining to a first embodiment of the present invention.

The first to sixth embodiments of the present invention will be described below with reference to the drawings. In the descriptions of the following drawings, the same or similar reference numerals are given to the same or similar portions. However, attention should be paid to a fact that, since the drawings are only schematic, a relation between a thickness and a planar dimension, and a ratio between the thicknesses of respective layers, and the like differ from the actual values. Thus, the specific thicknesses and dimensions should be judged by referring to the following explanations. Also, naturally, the portion in which the relation and ratio between the mutual dimensions are different is included even between the mutual drawings.

Also, because the following first to sixth embodiments exemplify the devices and methods to embody the technical idea of the present invention, the first to sixth embodiments can be applied to various solid-state imaging devices, such as an imaging device of a high-speed time-varying image, an imaging device of a static image to image a high-speed motion, avoiding any unintentional blurring of images due to hand movement, and the like. Also, in the technical idea of the present invention, the material quality, shape, structure, arrangement and the like of a configuration part are not limited to the followings, and various changes can be added to the technical idea of the present invention, within the technical scopes prescribed by claims.

First Embodiment

In a solid-state imaging device (two-dimensional image sensor) pertaining to a first embodiment of the present invention, as illustrated in FIG. 1, a pixel array 1 and peripheral circuits (2, 3, 4, 5 and 6) are integrated on the same semiconductor chip. In the pixel array 1, a large number of pixels $X_{ij}$ (i=1 to m; j=1 to n: where m, n are integers, respectively) are arrayed in the shape of a two-dimensional matrix, and for example, a rectangular imaging area is established. On the lower side of pixel array 1, a horizontal shift register 2 is provided along pixel rows $X_{11}$ to $X_{1m}$; - - - ; $X_{i1}$ to $X_{im}$; - - - ; $X_{(n-2)1}$ to $X_{(n-2)m}$; $X_{(n-1)1}$ to $X_{(n-1)m}$; and $X_{n1}$ to $X_{nm}$ directions. On the left side of pixel array, a vertical shift register 3 is provided along pixel columns $X_{l1}$, - - - , $X_{i1}$, - - - , $X_{(n-2)1}$, $X_{(n-1)1}$, $X_{n1}$; $X_{l2}$, - - - , $X_{i2}$, - - - ; $X_{(n-2)2}$, $X_{(n-1)2}$, $X_{n2}$; $X_{l3}$, - - - , $X_{i3}$, - - - ; $X_{(n-2)3}$, $X_{(n-1)3}$, $X_{n3}$; - - - ; $X_{lj}$, - - - , $X_{ij}$, - - - , $X_{(n-2)j}$, $X_{(n-1)j}$, $X_{nj}$; - - - ; $X_{lm}$, - - - , $X_{im}$, - - - , $X_{(n-2)m}$, $X_{(n-1)m}$, and $X_{nm}$ directions. A timing generator 4 is connected to the vertical shift register 3 and the horizontal shift register 2.

The timing generator, the horizontal shift register 2 and the vertical shift register 3 sequentially scan the unit pixels $X_{ij}$ in the pixel array 1, and a reading-out operation of pixel signals and an electronic-shuttering operation are executed. That is, the solid-state imaging device pertaining to the first embodiment of the present invention is organized such that, since the pixel array 1 is vertically scanned at the respective pixel rows $X_{11}$ to $X_{1m}$; - - - ; $X_{i1}$ to $X_{im}$; - - - ; $X_{(n-2)1}$ to $X_{(n-2)m}$; $X_{(n-1)1}$ to $X_{(n-1)m}$; and $X_{n1}$ to $X_{nm}$ units, the pixel signal of each of pixel rows $X_{l1}$ to $X_{lm}$; - - - ; $X_{i1}$ to $X_{im}$; - - - ; $X_{(n-2)1}$ to $X_{(n-2)m}$; $X_{(n-1)1}$ to $X_{(n-1)m}$; and $X_{n1}$ to $X_{nm}$ is read out through a vertical signal line laid for each of pixel columns $X_{l1}$, - - - , $X_{i1}$, - - - , $X_{(n-2)1}$, $X_{(n-1)1}$, $X_{n1}$; $X_{l2}$, - - - , $X_{i2}$, - - - ; $X_{(n-2)2}$, $X_{(n-1)2}$, $X_{n2}$; $X_{l3}$, - - - , $X_{i3}$, - - - ; $X_{(n-2)3}$, $X_{(n-1)3}$, $X_{n3}$; - - - ; $X_{lj}$, - - - , $X_{ij}$, - - - , $X_{(n-2)j}$, $X_{(n-1)j}$, $X_{nj}$; - - - ; $X_{lm}$, - - - , $X_{im}$, - - - , $X_{(n-2)m}$, $X_{(n-1)m}$ and $X_{nm}$. The pixel signals read from the respective vertical signal lines are signal-processed by noise canceling circuits (Correlated Double Sampling) $CDS_1$ to $CDS_m$ in a signal processor 5, respectively, and then supplied as an imaging signal $V_2$ through an amplifier 6 to an external circuit whose illustration is omitted.

Figure 2:
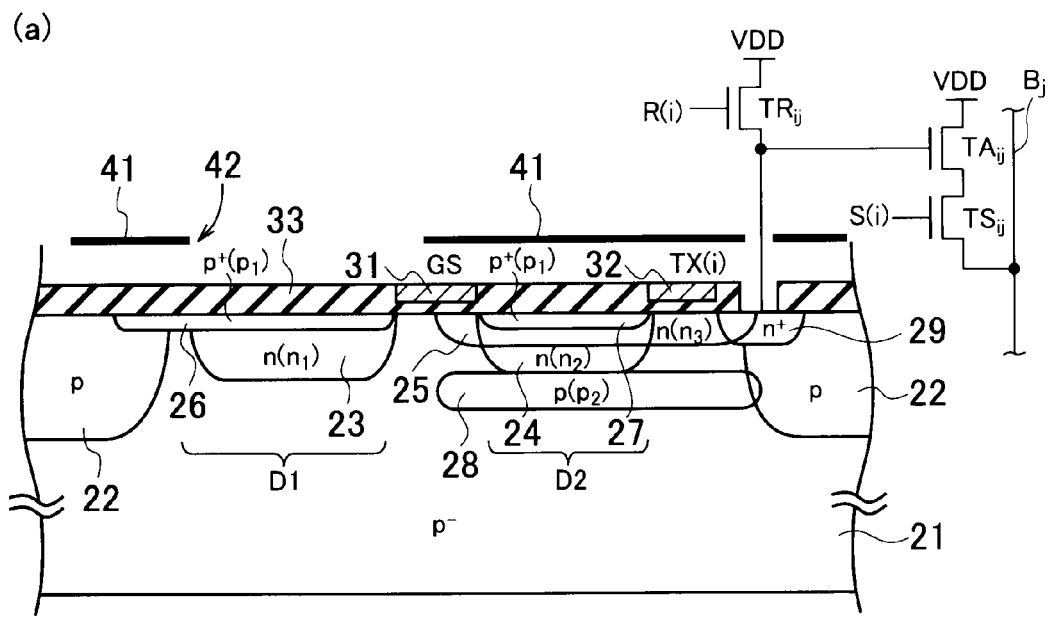
FIG. 2 (a) is a schematic cross-sectional view describing a configuration of a semiconductor element that serves as a part of pixels in the solid-state imaging device pertaining to the first embodiment of the present invention.
Figure 2:
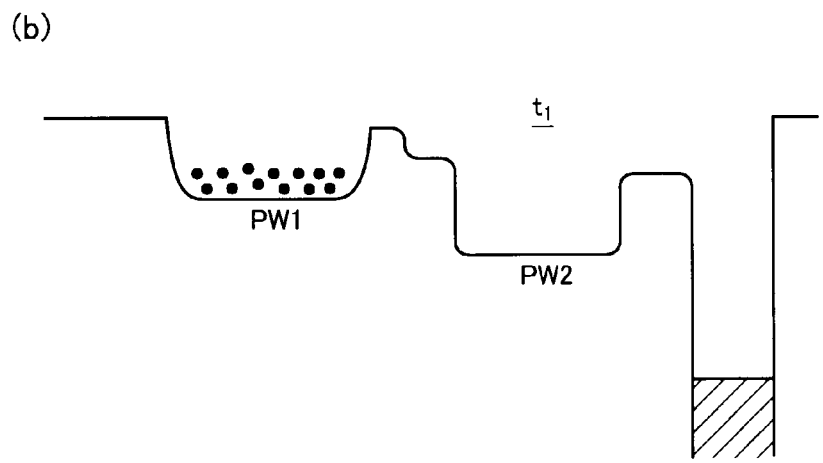
Figure 2:
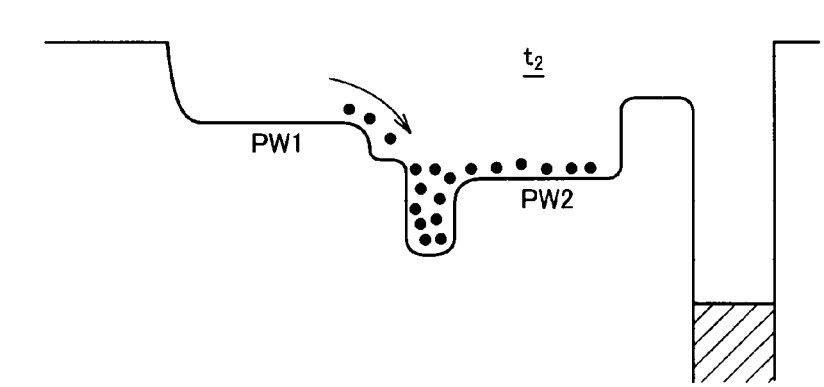

FIG. 2 (a) illustrates one example of the cross-sectional structure of the semiconductor element that serves as each of pixels $X_{11}$ to $X_{1m}$; - - - ; $X_{i1}$ to $X_{im}$; - - - ; $X_{(n-2)1}$ to $X_{(n-2)m}$; $X_{(n-1)1}$ to $X_{(n-1)m}$; and $X_{n1}$ to $X_{nm}$ in the solid-state imaging device pertaining to the first embodiment.

As illustrated in FIG. 2 (a), the semiconductor element serving as the pixel $X_{ij}$ encompasses a base-body region 21 implemented by a semiconductor of a first conductivity type (p-type); a charge-generation buried region (cathode region) 23 of a second conductivity type (n-type) which is buried in an upper portion of the base-body region 21 and to which light is entered; an accumulation region 24 of a second conductivity type ($n^+$-type), which is buried in a part of the upper portion of the base-body region 21, separately from the charge-generation buried region (cathode region) 23 and in which direction of field where signal charges move is defined as depth direction, and a depth of the bottom of potential valley is deeper than the bottom of potential valley (electron well) of the charge-generation buried region 23 (see FIGS. 2 (b), 2 (c), 3 (d) and 3 (e)), and charges generated by the charge-generation buried region 23 are accumulated; a read-out region 29 of the second conductivity type ($n^+$-type), which is buried in a part of the upper portion of the base-body region 21, separately from the accumulation region 24 and receives charges accumulated in the accumulation region 24; and a capacitor-implement region 25 of the second conductivity type (n-type) which is arranged from a part of the portion between the charge-generation buried region 23 and the accumulation region 24, in the upper portion of the base-body region 21, to a portion between the accumulation region 24 and the read-out region 29 and is lower in impurity concentration than the accumulation region 24. Because electrons move toward the high direction of potential, and holes move toward the low direction of potential, "the direction of field toward which signal charges move" implies direction opposite to an electric line of force, for the electron, and implies direction of the electric line of force, for the hole. A well (p-well) 22 of the first conductivity type that is higher in impurity concentration than the base-body region 21 is formed so as to surround the charge-generation buried region 23, the accumulation region 24 and the read-out region 29. Below the accumulation region 24, a block layer 28 is formed such that a planar pattern viewed from the above coincides with the capacitor-implement region 25. FIG. 2 (a) exemplifies a case in which the base-body region 21 of the first conductivity type (p-type) is used as "the base-body region of the first conductivity type". However, instead of the base-body region 21, a silicon epitaxial-growth layer of the first conductivity type, which is lower in impurity concentration than the semiconductor substrate, is formed on a semiconductor substrate of the first conductivity type, and the epitaxial-growth layer may be employed as the base-body region 21 implemented by the semiconductor of the first conductivity type. Also, the silicon epitaxial-growth layer of the first conductivity type (p-type) is formed on a semiconductor substrate of the second conductivity type (n-type), and the epitaxial-growth layer may be employed as the base-body region 21 implemented by the semiconductor of the first conductivity type. When the epitaxial-growth layer of the first conductivity type (p-type) is formed on a semiconductor substrate of the second conductivity type (n-type) so as to form p-n junction, in a case of a long wavelength, light is penetrated into the deep portion of the semiconductor substrate of the second conductivity type. However, because carriers generated by the light in the semiconductor substrate of the second conductivity type cannot be penetrated up to the epitaxial-growth layer of the first conductivity type owing to a potential barrier generated by built-in potential of p-n junction, it is possible to positively remove the carriers generated in the deep portion of the semiconductor substrate of the second conductivity type. Consequently, it is possible to protect the carriers, which are generated in the deep position, from being diffused, returned and leaked into the adjacent pixel. In particular, the implementation of p-n junction achieves an effectiveness that colors are not mixed, in a case of a color image sensor of a single-chip on which a color filter of RGB is provided.

When the wavelength of the light received by the solid-state imaging device pertaining to the first embodiment is long and electrons generated in the deep portion of the base-body region 21 are returned back to the surface by diffusion, the block layer 28 can block a part of electrons from being captured in the accumulation region 24. Consequently, even if the wavelength of the use light, for example, such as nearinfrared light and the like, is long, it is possible to suppress the influence, in which electrons generated in the deep portion of the base-body region 21 are returned back to the surface by diffusion, on the modulation performance of the transferring to the accumulation region 24 of the generated electrons caused by the potential control of a transfer-gate electrode 31.

The charge-generation buried region (cathode region) 23 and the base-body region (anode region) 21 just under the charge-generation buried region (cathode region) 23 implement a first buried photodiode (hereafter, merely referred to as "a photodiode") D1. The accumulation region (cathode region) 24 and the base-body region (anode region) 21 just under the accumulation region 24 implement a second buried photodiode (hereafter, referred to as "a charge accumulation diode") D2.

A first pining layer 26 of $p^+$-type is arranged from a part of the well 22 to the upper portion of the charge-generation buried region 23, and a second pining layer 27 of $p^+$-type is arranged in the upper portion of the accumulation region 24. The first pining layer 26 and the second pining layer 27 are the layers for suppressing the carriers from being generated on the surface at a dark time and used as the preferable layers for the sake of dark current reduction.

A gate insulation film 33 is formed on the base-body region 21. As the gate insulation film 33, a silicon oxide film ($SiO_2$) is preferable. However, an insulated-gate structure of an insulated-gate transistor (MIS transistor), in which various insulation films other than the silicon oxide film are used, may be available. For example, an ONO film implemented by a triple-level lamination film made of silicon oxide film/silicon nitride film ($Si_3N_4$ film)/silicon oxide film may be available. Moreover, the oxide that includes at least one element of strontium (Sr), aluminum (Al), magnesium (Mg), yttrium (Y), hafnium (Hf), zirconium (Zr), tantalum (Ta) and bismuth (Bi), or the silicon nitride that includes those elements, or the like can be used as the gate insulation film 33.

A transfer-gate electrode (a gate electrode for electronic shutter) 31, which controls a potential of a transfer channel formed between the charge-generation buried region 23 and the accumulation region 24 and transfers electrons (charges) generated by the charge-generation buried region 23 from the charge-generation buried region 23 to the accumulation region 24 and then operates a global electronic shuttering, and a read-out-gate electrode 32, which controls a potential of a transfer channel formed between the accumulation region 24 and the read-out region 29 and transfers charges from the accumulation region 24 to the read-out region 29, are arranged on the gate insulation film (transfer-gate insulation film) 33. The gate insulation film (transfer-gate insulation film) 33 and the transfer-gate electrode 31 on the gate insulation film (transfer-gate insulation film) 33 implement a first potential control means (31, 33) configured to control the potential of the channel formed in the upper portion of the base-body region 21 between the charge-generation buried region 23 and the accumulation region 24 and to extract charges from the charge-generation buried region 23 to the accumulation region 24. Also, the gate insulation film (read-out gate insulation film) 33 and the read-out-gate electrode 32 on the gate insulation film (read-out gate insulation film) 33 implement a second potential control means (32, 33) configured to control the potential of the channel formed in the upper portion of the base-body region 21 between the accumulation region 24 and the read-out region 29, and to transfer charges from the accumulation region 24 to the read-out region 29.

In a part of the side of the accumulation region 24 below the transfer-gate electrode 31, the capacitor-implement region 25 is arranged in the upper portion of the base-body region 21.

Then, an area where the transfer-gate electrode 31 faces to the capacitor-implement region 25 and the capacitor-implement region 25 by itself implement a parallel plate structure through the gate insulation film 33, and the parallel plate structure establishes a first MOS capacitor (31, 33, 25). Because the capacitor-implement region 25 spans from the site of the first MOS capacitor (31, 33, 25) to the upper portion of the base-body region 21 located below the read-out-gate electrode 32, the read-out-gate electrode 32, the gate insulation film 33 and the capacitor-implement region 25 implement a second MOS capacitor (32, 33, 25), similarly to the first MOS capacitor (31, 33, 25).

FIGS. 2 (b), 2 (c), 3 (d) and 3 (e) are the potential diagrams on a horizontal plane, which cut the charge-generation buried region 23, the accumulation region 24, the capacitor-implement region 25 and the read-out region 29, in view of the cross-sectional view of FIG. 2 (a), and charges (electrons) are illustrated by closed circles. Corresponding to the structure illustrated in FIG. 2 (a), a potential valley (first potential valley) PW1 of a conduction band edge of the charge-generation buried region 23 is represented on the left side of potential barrier (the electronic-shuttering potential barrier) in the center of FIG. 2 (b). On the other hand, a potential valley (second potential valley) PW2 of a conduction band edge of the accumulation region 24 is represented on the right side of the first potential valley PW1, through a potential barrier (the electronic-shuttering potential barrier).

In the description of the solid-state imaging device pertaining to the first embodiment, because a case in which the first conductivity type is assigned as p-type, the second conductivity type is assigned as n-type, and the signal charge on which the processes such as transfer, accumulation or the like is performed is assigned as the electron is exemplarily described. Consequently, in the potential diagrams illustrated in FIGS. 2 (b), 2 (c), 3 (d) and 3 (e), the lower direction (depth direction) of the drawing is represented as the positive direction of potential, and the lower direction is the direction of field toward which the signal charges generated by the photodiode move. Thus, in this case in which the first conductivity type is assigned as n-type and the second conductivity type is assigned as p-type so that the electrical polarities are opposite, the signal charges to be processed become holes. However, for holes, the potential shape that indicates the potential barrier, the potential valley, the potential well and the like in the semiconductor element is represented such that the lower direction (depth direction) of the drawing is defined as the negative direction of potential. However, even in this case that the signal charges are holes, although potential is opposite, the lower directions of FIGS. 2 (b), 2 (c), 3 (d) and 3 (e) are the direction of field toward which the signal charges (holes) generated by the photodiode move.

Between the first potential valley PW1 and the second potential valley PW2, a stair-like-shaped potential barrier (the electronic-shuttering potential barrier) is established, in which difference in level is created by a top level and a shoulder level that is located on the right side of the top level and lower than the top level. That is, in the electronic-shuttering potential barrier, the portion corresponding to the first MOS capacitor (31, 33, 25) at the location of the second potential valley PW2 is deeper than the top level at the location of the first potential valley PW1 and creates a shoulder in staircase. On the side of the first potential valley PW1, the portion corresponding to a site on the left side of the first MOS capacitor (31, 33, 25), just under the transfer-gate electrode 31 of the region, in which the capacitor-implement region 25 does not exist, creates the top level higher than the shoulder level. Thus, because the stair-like-shaped potential barrier (the electronic-shuttering potential barrier) provided between the first potential valley PW1 and the second potential valley PW2 corresponds to the potential distribution of the conduction band edge of the base-body region 21 just under the transfer-gate electrode 31, the height of the top level is changed by voltages of control signal GS applied to the transfer-gate electrode 31, while a qualitative relation of relative level between the top level and the shoulder level is kept.

Moreover, the potential well of the read-out region 29 is represented on the right side of the second potential valley PW2. In the potential well of the read-out region 29, a portion indicated by diagonal hatch with upward oblique lines to the right is potential levels in which electrons are filled, and the upper edge of the portion indicated by diagonal hatch with upward oblique lines to the right is the position of Fermi energy level. Thus, the position of the upper edge of the portion indicated by the diagonal hatch with upward oblique lines to the right corresponds to the position of the bottom of potential well created by the read-out region 29. The potential barrier (the potential barrier for reading out) between the second potential valley PW2 and the potential well of the read-out region 29 corresponds to the potential distribution of the conduction band edge of the base-body region 21 just under the read-out-gate electrode 32. In the solid-state imaging device pertaining to the first embodiment, the control signal GS is applied to the respective transfer-gate electrodes (the gate electrodes for the electronic shutter) 31 for all of pixels, simultaneously, and, electrons (charges) generated by the respective charge-generation buried regions 23 are transferred to the respective accumulation regions 24, and the operation of the global electronic shutter is carried out.

As illustrated in FIGS. 2 (b), 2 (c), 3 (d) and 3 (e), in order that a depth of the first potential valley PW1 when the charge-generation buried region 23 is perfectly depleted is shallower than a depth of the second potential valley PW2 when the accumulation region 24 is perfectly depleted, the respective impurity concentrations may be selected, for example, such that the impurity concentration of the accumulation region 24 is higher than the impurity concentration of the charge-generation buried region 23. As a method of setting the impurity concentration of the accumulation region 24 to be higher than the charge-generation buried region 23, it is possible to employ the known various methods.

The height of the top level of electronic-shuttering potential barrier between the first potential valley PW1 and the second potential valley PW2, and the height of potential barrier for reading out between the second potential valley PW2 and the potential well of the read-out region 29 are changed by the voltages of the control signal GS and the control signal TX, which are applied to the transfer-gate electrode 31 and the read-out-gate electrode 32, respectively.

As illustrated in FIG. 2 (a), a gate electrode of a signal-read-out transistor (amplification transistor) $TA_{ij}$ implementing a read-out-buffer amplifier is connected to the read-out region 29 of pixel $X_{ij}$. A drain electrode of the signal-read-out transistor (amplification transistor) $TA_{ij}$ is connected to a power supply VDD, and a source electrode is connected to a drain electrode of a switching transistor $TS_{ij}$ for pixel selection. A source electrode of the switching transistor $TS_{ij}$ for the pixel selection is connected to a vertical signal line $B_j$, and control signal S(i) for selecting a horizontal line is applied to the gate electrode from the vertical shift register 3. When the control signal S(i) for selecting is set to high (H) level, the switching transistor $TS_{ij}$ is turned on, and a current, which is amplified by the signal-read-out transistor (amplification transistor) $TA_{ij}$ and corresponds to the potential of the read-out region 29, flows through the vertical signal line B. Moreover, a source electrode of a reset transistor $TR_{ij}$ implementing the read-out-buffer amplifier is connected to the read-out region 29. A drain electrode of the reset transistor $TR_{ij}$ is connected to the power supply VDD, and reset signal R(i) is applied to the gate electrode. By setting the reset signal R(i) to high (H) level, charges accumulated in the read-out region 29 are extracted, and the read-out region 29 is reset.

<Operation of Solid-State Imaging Device>

The operation of the solid-state imaging device (two-dimensional image sensor) pertaining to the first embodiment of the present invention will be described below by using the timing chart illustrated in FIG. 4 and FIGS. 2 (b), 2 (c), 3 (d) and 3 (e). FIGS. 2 (b), 2 (c), 3 (d) and 3 (e) are the potential diagrams, which correspond to times $t_1$, $t_2$, $t_3$ and $t_4$ illustrated in FIG. 4, respectively.

Figure 4:
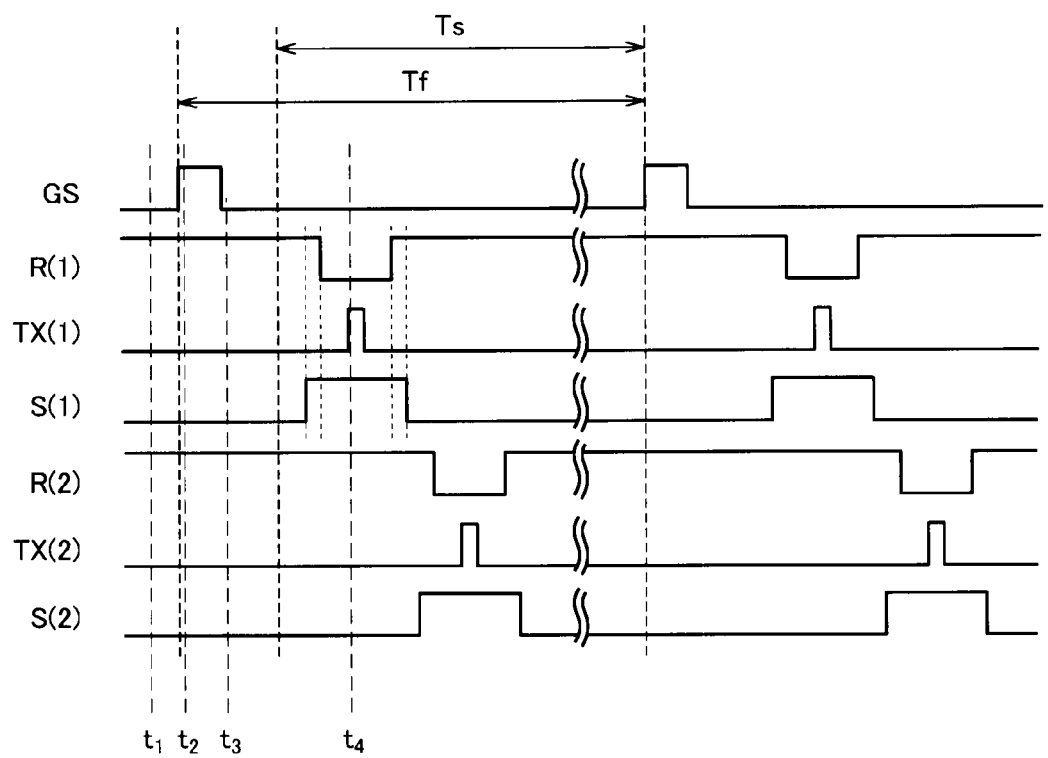
FIG. 4 is a timing chart describing a reading-out method of the solid-state imaging device pertaining to the first embodiment of the present invention.

(a) At first, at time $t_1$ illustrated in FIG. 4, when a low voltage (0 V, or a negative voltage of about −1 V) as the control signal GS is applied to the transfer-gate electrode 31, as illustrated in FIG. 2 (b), the stair-like-shaped electronic-shuttering potential barrier against electrons is created between the charge-generation buried region 23 and the accumulation region 24. Electrons (charges) generated in the charge-generation buried region 23 are accumulated in the charge-generation buried region 23 without being transferred to the accumulation region 24. The control signal GS is applied simultaneously to all of pixels so as to operate the global electronic shuttering.

(b) Next, at time $t_2$, when the high voltage (positive voltage) as the control signal GS is applied to the transfer-gate electrode 31, as illustrated in FIG. 2 (c), the position of the top level of electronic-shuttering potential barrier between the charge-generation buried region 23 and the accumulation region 24 is shifted to the direction of field toward which the signal charges move, while the relative-level relation between the top level and the shoulder level is kept. That is, because FIG. 2 (c) is the potential diagram for electrons, in which the lower direction of the drawing is represented as the positive direction of potential, the potential for electrons at the top level of electronic-shuttering potential barrier increases (by the way, when the first conductivity type is assigned as n-type and the second conductivity type is assigned as p-type so that the signal charges serves as holes, in FIG. 2 (c), because the upper direction of the drawing shall be represented as the positive direction of potential, the potential for holes at the top level of electronic-shuttering potential barrier decreases). Here, because the electronic-shuttering potential barrier between the first potential valley PW1 and the second potential valley PW2 has the stair-like-shape at time $t_1$, as illustrated in FIG. 2 (c), in association with the movement (the movement to the positive direction of potential) along the direction of field toward which the signal charges (electrons), the position of the top level moves, the height of the shoulder level corresponding to the first MOS capacitor (31, 33, 25) adjacent to the accumulation region 24 becomes deep in the direction of field toward which the signal charges move (the potential for electrons increases) at time $t_2$, as compared with the second potential valley PW2, and, the portion that is made deep exhibits the shape of the well-shaped potential distribution for the signal charges (electrons) at time $t_2$. By the way, although FIG. 2 (c) illustrates a shape in which as compared with the shape illustrated in FIG. 2 (b), the shoulder level is deeper, and the difference between the top level and the shoulder level is large, in the shape illustrated in FIG. 2 (c), the relative-level relation between the top level and the shoulder level is qualitatively kept. Consequently, electrons generated in the charge-generation buried region 23 are transferred to the potential well created by the first MOS capacitor (31, 33, 25). Because the second potential valley PW2 is continuously created to the well-shaped potential distribution shape, even if the quantity of the signal charges is large, electrons overflows from the potential well created by the first MOS capacitor (31, 33, 25) and is directly accumulated in the potential valley created by the accumulation region 24, and therefore, the signal charges can be protected from being left on the potential valley created by the charge-generation buried region 23. Hence, when the capacitance of the charge accumulation diode D2 is designed to be large, the capacitance of the first MOS capacitor (31, 33, 25) can be made small.

Figure 3:
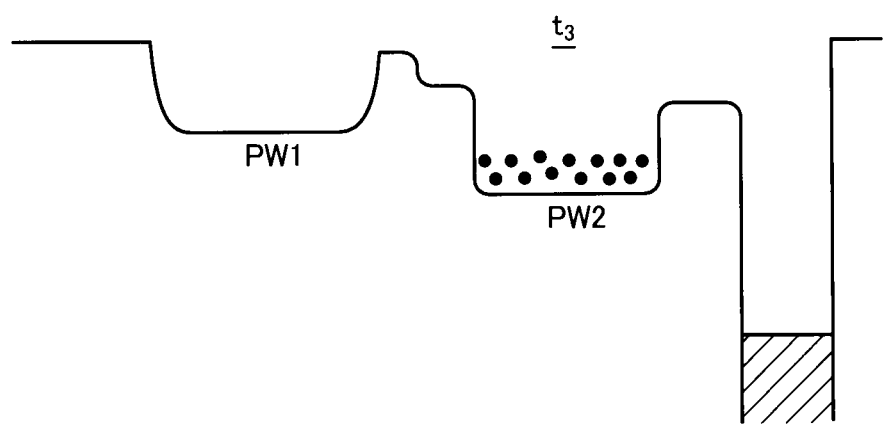
FIG. 3 (d) is a potential diagram describing the manner when the signal charges (electrons) are transferred, in which the lower direction is defined as the positive direction of potential.
Figure 3:
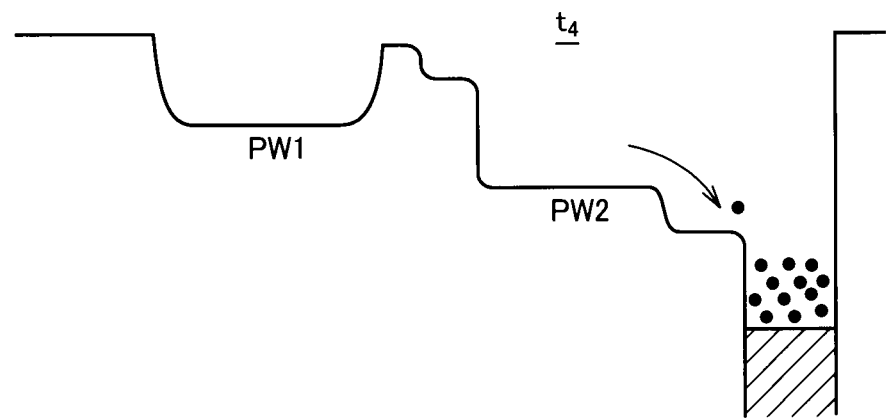

(c) At time $t_3$, when the low voltage (0 V, or the negative voltage of about −1 V) as the control signal GS is applied to the transfer-gate electrode 31, as illustrated in FIG. 3 (d), between the charge-generation buried region 23 and the accumulation region 24, because the height of the top level of electronic-shuttering potential barrier increases to the direction in which the height of potential barrier is made high, while the relative-level relation between the top level and the shoulder level is again kept, all of electrons including electrons, which has been accumulated in the potential well created by the first MOS capacitor (31, 33, 25), are transferred to the accumulation region 24. With the interposition of potential well created by the first MOS capacitor (31, 33, 25), charges can be perfectly transferred to the accumulation region 24, even if the potential difference between the first potential valley PW1 and the second potential valley PW2 is small. Here, as the control signal TX(i), the low voltage (0 V, or the negative voltage of about −1 V) is applied to the read-out-gate electrode 32. As illustrated in FIG. 3 (d), because the potential barrier for reading out is created between the accumulation region 24 and the read-out region 29, electrons accumulated in the accumulation region 24 are not transferred to the read-out region 29.

(d) At time $t_4$, when the high voltage (positive voltage) as the control signal TX(i) is applied to the read-out-gate electrodes 32 of pixels $X_{11}$ to $X_{1m}$, as illustrated in FIG. 3 (e), the height of potential barrier for reading out between the accumulation region 24 and the read-out region 29 is decreased or extinguished, and the signal charges are transferred from the accumulation region 24 to the read-out region 29. In this way, the direction E of field toward which the signal charges move is assumed to be the depth direction, and between the first potential valley PW1 and the second potential valley PW2 of the depletion potential that is deeper than the depletion potential of the first potential valley PW1, the stair-like-shaped electronic-shuttering potential barrier is provided, in which a portion neighboring to the second potential valley PW2 creates the shoulder level deeper than the top level of its left side, and then, by raising or lowering the top level of electronic-shuttering potential barrier, it is possible to achieve the perfect transfer of charges. Also, when the amount of signal charges are sufficiently small, because the signal charges can be transiently accumulated only by the first MOS capacitor (31, 33, 25), it is possible to avoid the signal charges from being captured by the interface state. Hence, it is possible to effectively suppress the residual image that becomes problematic in the pixel in which the signal charge is small.

In an accumulation time $T_s$ illustrated in FIG. 4, simultaneously with the accumulation of charges through exposure to the charge-generation buried region 23, the operation for reading out charges accumulated in the accumulation region 24 is performed on a pixel signal corresponding to one row that is selected by the output from the vertical shift register 3, in synchronization with the charge transfer in the pixel. When a subject frame period $T_f$, measured from the rise time of the control signal GS, elapses, the next control signal GS is applied, and charges accumulated in the charge-generation buried region 23 in the subject frame period, which is a frame immediately before the present frame, in the sequence of the frame periods, are transferred to the accumulation region 24.

In the reading-out operation, the level proportional to the signal charges accumulated in the read-out region 29 is reads out to a noise cancelling circuit $CDS_j$ of the corresponding column, for each horizontal line, and, after noise cancel is carried out by the noise canceling circuits $CDS_1$ to $CDS_m$, a horizontal scan is carried out. At first, a pulse of reset signal R(i) is applied, and then, a voltage when the read-out region 29 is reset is sampled, and the voltage is stored as a reset voltage $V_R$ in the noise cancelling circuit $CDS_j$, on the basis of a $f_R$ pulse. The reset voltage $V_R$ includes random noise component, which is referred to as reset noise (kTC noise) superimposed when the read-out region 29 is reset, and fixed pattern noise component, which is caused by the variation in threshold voltages of amplifying transistors and generated in each of pixels. Next, the control signal TX(i) is applied to transfer the signal charges from the charge-generation buried region 23 through the accumulation region 24 to the read-out region 29. Since the read-out region 29 is designed to have a very small capacitance, the voltage of the read-out region 29 is changed by the signal charges. Therefore, the source follower output of the voltage read out from the read-out region 29 is defined as a signal voltage $V_S$, and the signal voltage $V_S$ are sampled and stored by the noise canceling circuits $CDS_1$ to $CDS_m$.

A difference $\Delta V$ between the signal voltage $V_S$ and the reset voltage $V_R$ is represented by the following Eq. (1):

$$\Delta V = V_R - V_S \qquad (1)$$
$$= V_R - (V_R - G_{SF}G_C N_{SIG})$$
$$= G_{SF}G_C N_{SIG}$$

Here, $G_{SF}$ is a gain of the source flower, and $G_C$ is a charge voltage conversion gain, and $G_C$ is represented by the following Eq. (2):

$$G_C = q/C_{FD} \qquad (2)$$

q is elementary electric charge, and $C_{FD}$ is capacitance of the read-out region 29. From Eq. (1), because the noise components included in the reset voltage $V_R$ are cancelled by Correlated Double Sampling (CDS), it is possible to extract only the voltage proportional to the signal charges.

As mentioned above, the solid-state imaging device pertaining to the first embodiment executes operation of two-stage transfer, in which in the semiconductor element as the pixel, at first, when the control signal GS is applied to the transfer-gate electrode 31, charges accumulated in the charge-generation buried region 23 are transferred to the accumulation region 24, and then, when the control signal TX is applied to the read-out-gate electrode 32, charges accumulated in the accumulation region 24 are transferred to the read-out region 29.

In the solid-state imaging device pertaining to the first embodiment, the stair-like-shaped electronic-shuttering potential barrier, the stair-like-shape is implemented by the top level and the shoulder level, is created between the first potential valley PW1 and the second potential valley PW2. Thus, even if the potential difference between the first potential valley PW1 and the second potential valley PW2 is small, because the signal charges can be accumulated in the first MOS capacitor (31, 33, 25), which corresponds to the recess in the electronic-shuttering potential barrier, the signal charges are perfectly transferred to the accumulation region 24 without being left in the charge-generation buried region 23. Also, even if the quantity of the signal charges is large, because charges can be accumulated in the first MOS capacitor (31, 33, 25), charges can be perfectly transferred to the accumulation region 24 without being left in the charge-generation buried region 23.

<Manufacturing Method of Semiconductor Element and Solid-State Imaging Device>

Figure 5:
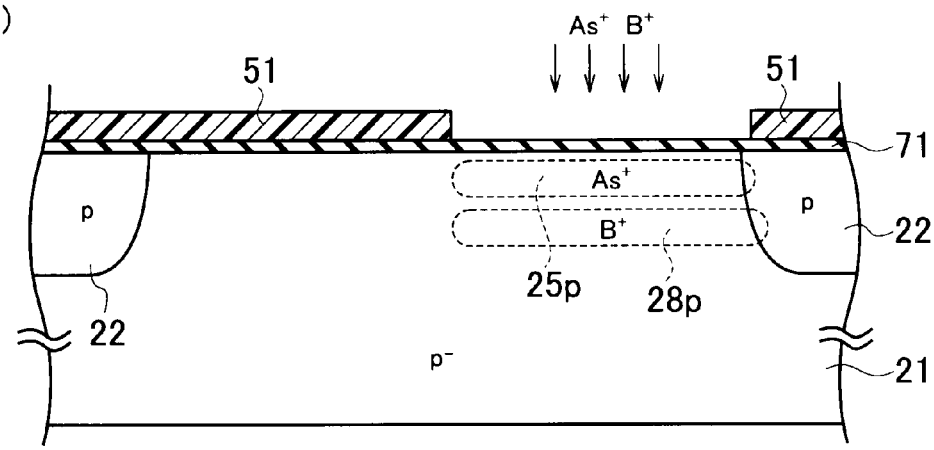
FIGS. 5 (a), 5 (b) and 5 (c) are process-flow cross-sectional views describing the manufacturing method of the semiconductor element and the solid-state imaging device pertaining to the first embodiment of the present invention.
Figure 5:
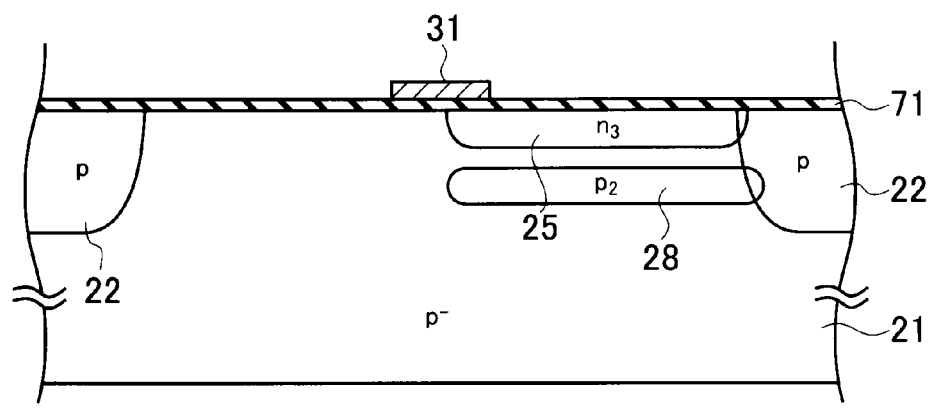
Figure 5:
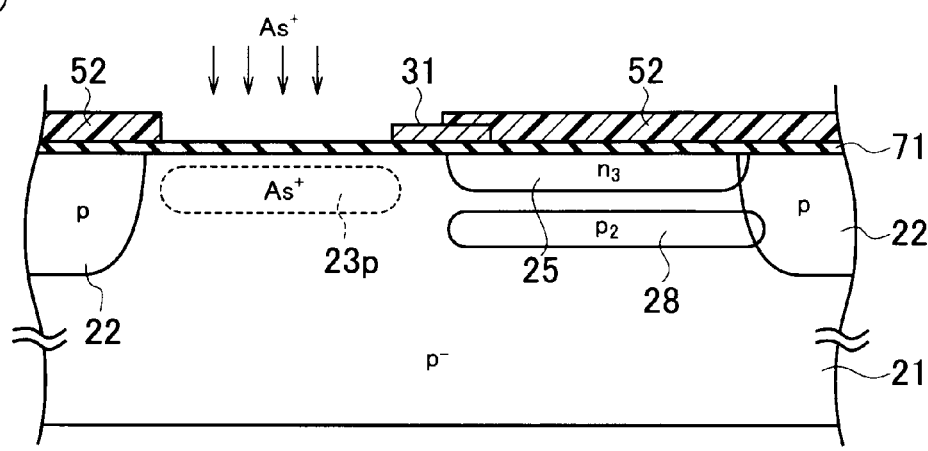

A manufacturing method of the semiconductor element and the T solid-state imaging device pertaining to the first embodiment of the present invention illustrated in FIG. 2 (*a*) will be described below by using FIGS. 5 to 6, while focusing attention to the semiconductor element (pixel). By the way, because the manufacturing method of the semiconductor element and the solid-state imaging device, which will be described below, indicates one example, the semiconductor element and the solid-state imaging device can be naturally achieved by using various manufacturing methods other than the following method, including the variation example of the manufacturing method:

(a) At first, a p-type semiconductor substrate whose main surface is a (100) plane between about 30 and 0.65 Ωcm (the impurity concentration is about $4\times10^{14}$ cm$^{-3}$ or more and about $3\times10^{16}$ cm$^{-3}$ or less) is prepared as the base-body region 21. After a thermal oxide film (SiO$_2$ film) of about 150 nanometers is formed on the main surface of the base-body region 21 of p-type, a photoresist film is coated (spin-coated), and the photoresist film is delineated by photolithography technique, and a p-well implementation region is opened. Next, boron ($^{11}$B$^+$) ions of a dose quantity between about $10^{12}$ and $10^{13}$ cm$^{-2}$ are implanted through the thermal oxide film into the p-well implementation region. Next, the portion of the p-well implementation region in the thermal oxide film is etched and removed. Also, after the photoresist film is removed and a predetermined cleaning process is completed, the implanted boron ions are thermally diffused at about 1200° C., and the well (p-well) 22 is formed (see FIG. 5 (*a*)). Here, the well (p-well) 22 is simultaneously formed even in the peripheral circuit and the read-out-buffer amplifier, which is arranged in each pixel X$_{ij}$. Also, n-wells (whose illustration is omitted) are similarly formed on the peripheral circuit. Moreover, after all of the thermal oxide films on the main surface of the base-body region 21 are removed (stripped), a pad oxide film (SiO$_2$ film) having a film thickness of about 100 nanometers is again formed on the main surface of the base-body region 21 by using the thermal oxidizing method. After that, a CVD method is used to grow a nitride film (Si$_3$N$_4$ film) having a film thickness of about 200 nanometers. The photoresist film delineated by photolithography technique is formed on the nitride film, and with the photoresist film as a mask, reactive ion etching (RIE) is performed, and the mask of the nitride film for selective oxidization (LOCOS) is formed.

(b) Next, although the illustration is omitted, after the removal of the nitride film, a dummy oxide film having a film thickness of several 10 nanometers is formed on the element-formation region. Then, after photolithography technique is used to cover the well 22 of the peripheral circuits with the photoresist film, the impurity ions for the gate-threshold voltage control (V$_{th}$-control) of pMOS are implanted. Next, after the removal of photoresist film, the pattern of photoresist film is delineated on the region except the well 22, by using photolithography technique. In succession, simultaneously with the wells 22 of the peripheral circuits and the read-out-buffer amplifier, the impurity ions for the gate-threshold voltage control of nMOS are implanted into the well 22. After that, the photoresist film is removed. Moreover, the dummy oxide film used as the protection film for implanting Vth-control ions is stripped off.

(c) Next, the surface of the base-body region 21 is thermally oxidized to form a gate insulation film 71 made of oxide film (SiO$_2$ film). Then, as illustrated in FIG. 5 (*a*), a photoresist film 51 is coated on the gate insulation film 71. Then, photolithography technique is used to cut a window in the photoresist film 51 so that the upper portions of the regions of the capacitor-implement region 25 of the second conductivity type and the block layer 28 are opened. Using the photoresist film 51 as mask, arsenic ions ($^{75}$As$^+$) of a dose quantity, which results in an impurity concentration n$_3$ after activation, are implanted into a capacitor-implement region scheduled area of the second conductivity type on the surface of the base-body region 21. In succession, boron ions ($^{11}$B$^+$) of a dose quantity, which results in an impurity concentration p$_2$ after activation, are implanted into a block layer scheduled area below the capacitor-implement region scheduled area. FIG. 5 (*a*) illustrates a capacitor-implement region scheduled area 25*p* and a block layer scheduled area 28*p* with a dashed line. After that, when activation anneal is performed after the removal of photoresist film 51, as illustrated in FIG. 5 (*b*), the capacitor-implement region 25 and the block layer 28 are formed at the same planar position, in a planar pattern. In this way, since the capacitor-implement region 25 and the block layer 28 are formed by using the same mask and conducting ion implantation, it is possible to reduce the number of photoresist films. Also, it is possible to reduce the variation in the performance that is caused by mask-alignment displacement.

(d) Next, although the illustration is omitted, on the entire surface of the gate insulation film 71, the CVD method is used to deposit a poly-silicon film between about 200 and 400 nanometers. Moreover, using the photoresist film delineated by photolithography technique as the mask, the poly-silicon film is etched with RIE and the like. Consequently, the pattern of the transfer-gate electrode 31 is delineated such that the center of the transfer-gate electrode 31 overlaps with the edge of the capacitor-implement region 25. After that, as illustrated in FIG. 5 (*b*), the photoresist film used to delineate the transfer-gate electrode 31 is removed.

(e) Next, a photoresist film 52 is coated on the base-body region 21, and, photolithography technique is used to cut a window in the photoresist film 52 so that an area of the charge-generation buried region is opened. Then, as illustrated in FIG. 5 (*c*), using the photoresist film 52 and the transfer-gate electrode 31 as the masks, the arsenic ($^{75}$As$^+$) ions of the dose quantity, which results in an impurity concentration n$_1$ after the activation, are implanted into the charge-generation buried region scheduled area on the surface of the base-body region 21. FIG. 5 (*c*) illustrates a charge-generation buried region scheduled area 23*p* with a dashed line. With regard to the transfer-gate electrode 31, because the arsenic ($^{75}$As$^+$) ions are implanted in self-alignment methodology, the arsenic ($^{75}$As$^+$) ions are also implanted into the transfer-gate electrode 31. Simultaneously, the arsenic ($^{75}$As$^+$) ions are similarly implanted into an n-MOS transistor allocated in the p-wells in the peripheral circuits and the read-out-buffer amplifier, through self-alignment methodology with the poly-silicon gate electrode as the mask. Here, the arsenic ($^{75}$As$^+$) ions are also implanted into the poly-silicon gate electrode on the p-well of the peripheral circuits whose illustration is omitted. After that, the photoresist film 52 is removed, and spacers 35 are formed on the sides of the transfer-gate electrode 31, and then, when the necessary activation anneal is executed, the charge-generation buried region 23 of the impurity concentration $n_1$ is formed as illustrated in FIG. 6 (d).

(e) Next, after coating a photoresist film 53 on the base-body region 21, photolithography technique is used to cut a window in the photoresist film 53 so that an area for the accumulation region is opened. Then, as illustrated in FIG. 6 (e), using the photoresist film 53, the transfer-gate electrode 31 and the spacer 35 as the masks, the arsenic ($^{75}$As$^+$) ions of the dose quantity, which results in an impurity concentration $n_2$ after the activation, are implanted into the accumulation region scheduled area of the base-body region 21. FIG. 6 (e) illustrates an accumulation region scheduled area 24p with a dashed line. With regard to the transfer-gate electrode 31, because the arsenic ($^{75}$As$^+$) ions are implanted through self-alignment methodology, the arsenic ($^{75}$As$^+$) ions are also implanted into the transfer-gate electrode 31. Simultaneously, in accordance with necessity, the ions are similarly implanted into nMOS transistors allocated in the p-wells of the peripheral circuits and a voltage read-out-buffer amplifier, through self-alignment methodology, with the poly-silicon gate electrodes as the mask. Here, the arsenic ($^{75}$As$^+$) ions are also implanted into the poly-silicon gate electrodes on the nMOS transistor allocated in the p-well of the peripheral circuits whose illustration is omitted. After that, the photoresist film 53 is removed.

Figure 6:
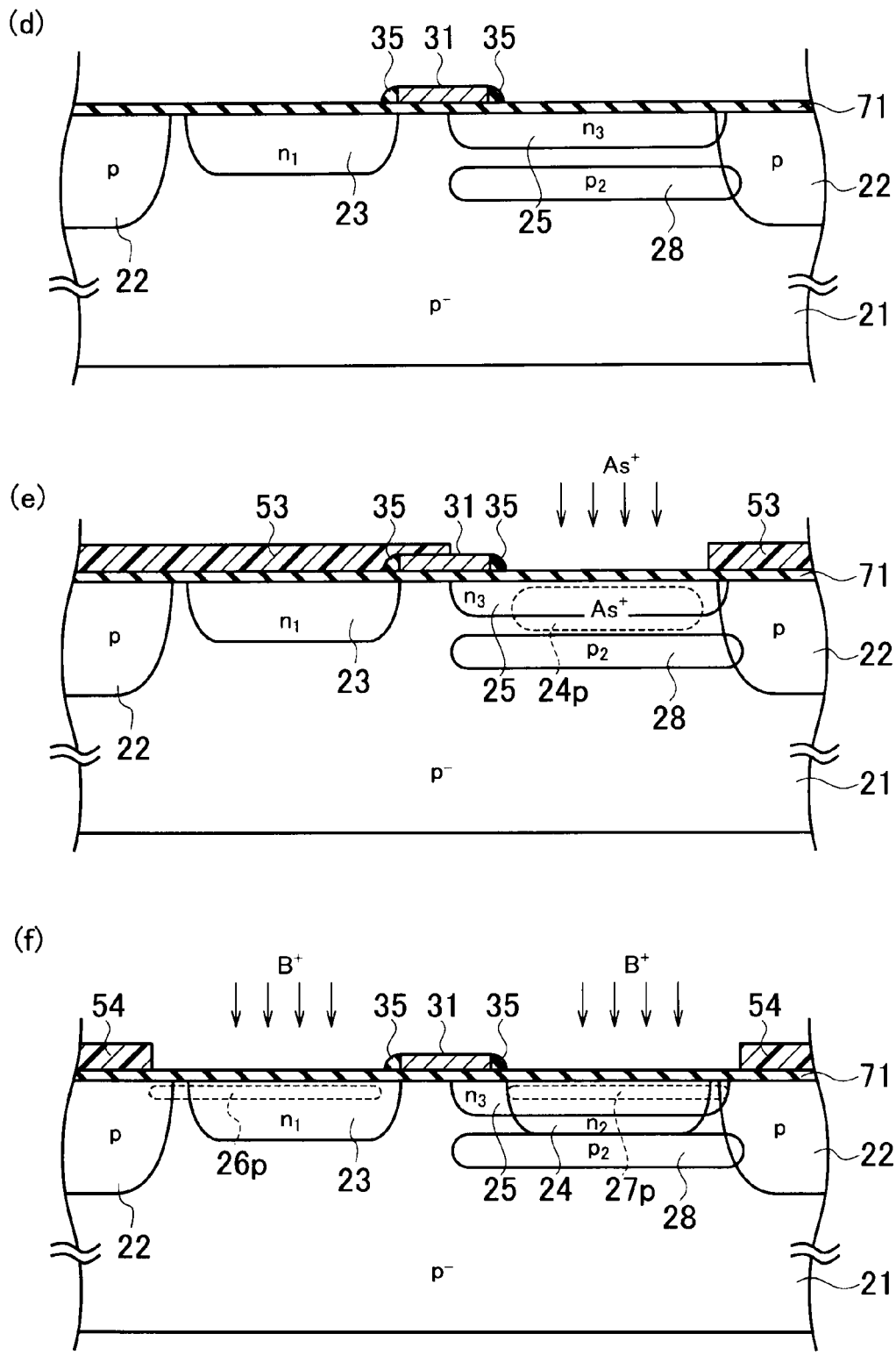
FIGS. 6 (d), 6 (e) and 6 (f) are process-flow cross-sectional views describing the manufacturing method of the semiconductor element and the solid-state imaging device pertaining to the first embodiment of the present invention.

(f) Next, after coating a different photoresist film 54 on the base-body region 21, with photolithography technique, as illustrated in FIG. 6 (f), using the photoresist film 54, the transfer-gate electrode 31 and the spacer 35 as masks, the boron ($^{11}$B$^+$) ions, which result in the dose quantity of an impurity concentration $p_1$ after the activation, are implanted into the base-body region 21, through self-alignment methodology. FIG. 6 illustrates a first pining layer scheduled area 26p and a second pining layer scheduled area 27p with dashed lines. Simultaneously, in accordance with necessity, the ions are similarly implanted into the n-wells of the peripheral circuits and the voltage read-out-buffer amplifier, through self-alignment methodology, with the poly-silicon gate electrode as the mask. Here, in accordance with necessity, the boron ($^{11}$B$^+$) ions are implanted into the poly-silicon gate electrodes of the nMOS transistors provided in the n-well of the peripheral circuits whose illustration is omitted. After that, when the new photoresist film is removed and an activation heat treatment (anneal) is performed on the base-body region 21, the accumulation region 24 of an n$^+$-type, the second pining layer 27 and the read-out region 29 of the n$^+$-type, which are higher in impurity concentration than the charge-generation buried region 23 of n-type, the first pining layer 26 and the charge-generation buried region 23, are formed in the base-body region 21, as illustrated in FIG. 2 (a). Similarly, n-type source/drain regions are formed in the well 22 and the like of the peripheral circuits whose illustrations are omitted. Here, because the phosphorus ($^{31}$P$^+$), the arsenic ($^{75}$As$^+$) and the boron ($^{11}$B$^+$), which are implanted into the transfer-gate electrode 31 and the read-out-gate electrode 32, are also activated, resistivity of the transfer-gate electrode 31 and the read-out-gate electrode 32 are made small.

(g) Next, although the illustrations of the drawings after FIG. 6 (f) are omitted, inter-layer insulation films are deposited in order to insulate the vertical signal lines and the horizontal scanning lines that connect the respective pixels, or the metallic wiring layers for the connections between the respective transistors in the peripheral circuits, or the portion between the poly-silicon films forming the gate electrodes (see FIG. 2 (a)). As the inter-layer insulation film, it is possible to use the various dielectric films, such as the composite film implemented by a double-level structure. The double-level structure encompasses an oxide film (CVD-SiO$_2$) having a film thickness of about 0.5 micrometer, which is deposited by the CVD method and a PSG film or a BPSG film having a film thickness of about 0.5 micrometer, which is deposited on the oxide film (CVD-SiO$_2$) by the CVD method. After the deposition by the CVD method, the heat treatment is performed. Consequently, the BPSG film in the upper layer of the composite film is reflowed, and the surface of the inter-layer insulation film is made flat. On the upper portion, using the photoresist film delineated by using photolithography technique as the mask, and the inter-layer insulation film is etched by the RIE or ECR ion etching and the like, and contact holes to connect the metallic wiring layers and the transistors are cut. After that, the photoresist film used to cut these contact holes is removed. Next, a sputtering method or an electron-beam vacuum evaporation method or the like is used to deposit an aluminum alloy film (Al—Si, Al—Cu—Si) having silicon and the like. On the aluminum alloy film, photolithography technique is used to delineate the mask of photoresist film, and while the mask is used, the aluminum alloy film is delineated by the RIE. Such series of processes are sequentially repeated. Consequently, the vertical signal lines and the horizontal scanning lines that connect the respective pixels, or the metallic wiring layers for the connections between the respective transistors in the peripheral circuits, or the like are formed. Moreover, the different inter-layer insulation films are deposited on the metallic wiring layers and the like. Then, photolithography technique is used to form the metallic film having the openings 42 just on the base-body region of each pixel, and the metallic film is used as the light shielding film 41 (see FIG. 2 (a)). Then, when a passivation film having a film thickness of about one micrometer, which is used to protect the mechanical damage and protect the immersions of water and impurities, is laminated on the light shielding film by using the CVD method, the solid-state imaging device pertaining to the first embodiment of the present invention is completed. The PSG film, the nitride film and the like are used in the passivation film.

The base-body region 21 preferably has the impurity concentration of about $5 \times 10^{12}$ cm$^{-3}$ or more and about $5 \times 10^{16}$ cm$^{-3}$ or less. As the impurity concentration of the charge-generation buried region 23, it is possible to employ the value in which the depletion is relatively easy, such as the value of about $1 \times 10^{17}$ cm$^{-3}$ or more and about $8 \times 10^{18}$ cm$^{-3}$ or less, and preferably, the value of about $2 \times 10^{17}$ cm$^{-3}$ or more and about $1 \times 10^{18}$ cm$^{-3}$ or less, and typically, for example, the value of about $8 \times 10^{17}$ cm$^{-3}$. Its thickness can be set between about 0.1 micrometer and 3 micrometers, preferably between about 0.1 and 0.3 micrometer. On the other hand, as the impurity concentration of the accumulation region 24, it is possible to employ the value, such as the value of about $1 \times 10^{17}$ cm$^{-3}$ or more and about $8 \times 10^{18}$ cm$^{-3}$ or less and preferably, the value of about $4 \times 10^{17}$ cm$^{-3}$ or more and about $2 \times 10^{18}$ cm$^{-3}$ or less, and typically, for example, the value of about $3 \times 10^{19}$ cm$^{-3}$. Its thickness can be set between about 0.1 micrometer and 3 micrometers and preferably between about 0.1 micrometer and 1.3 micrometers. When the impurity concentration of the accumulation region 24 is set to about 1.2 to 5 times the impurity concentration of the charge-generation buried region 23, preferably, about 1.5 to 2.5 times, the potential of the bottom of potential valley created by the accumulation region 24 is properly deeper than the potential of the bottom of potential valley created by the charge-generation buried region 23.

When the gate insulation film 33 is made of the thermal oxide film, the thickness of the thermal oxide film may be set to about 150 nanometers or more and about 1000 nanometers or less, preferably, about 200 nanometers or more and 400 nanometers or less. When the gate insulation film 33 is made of the dielectric film other than the thermal oxide film, an equivalent thickness converted with respect to a relative dielectric constant $\in_r$ (at 1 MHz, $\in_r$=3.8) of the thermal oxide film may be defined. For example, when the CVD oxide film having a relative dielectric constant $\in_r$=4.4 is used, a thickness in which the above thickness is multiplied by 1.16 (=4.4/3.8) may be employed, and when the silicon nitride ($Si_3N_4$) film having a relative dielectric constant $\in_r$=7 is used, a thickness in which the above thickness is multiplied by 1.84 (=7/3.8) may be employed. However, it is preferable to use the oxide film ($SiO_2$ film) produced by the standard CMOS technique, and the use of the field oxide film in the CMOS technique is suitable for simplifying the manufacturing steps. As illustrated in FIG. 2 (a), the opening 42 of the light shielding film 41 is selectively provided such that the generation of optical charges is carried out in the base-body region 21 just under the charge-generation buried region 23 implementing the photodiode D1. Although FIG. 2 (a) illustrates only the gate insulation film 33, the light shielding film 41 may be made of metallic thin film, such as aluminum (Al) and the like, which is provided on any upper portion inside a plurality of inter-layer insulation films for forming a multilevel wiring structure whose illustration is omitted.

According to the manufacturing method of the semiconductor element and the solid-state imaging device pertaining to the first embodiment of the present invention, after the formation of the capacitor-implement region 25, because the spacers 35 are formed on the sides of the transfer-gate electrode 31 so that the ions can be implanted through the spacers 35, as illustrated in FIG. 6 (e), for forming the accumulation region 24 of $n^+$-type, the dip portion in which the impurity concentration is high can be protected from being formed at the edge of the accumulation region 24, and therefore, the generation of leakage current can be suppressed. Also, because the dip portion can be protected from being formed at the edge of the accumulation region 24, for example, as illustrated in FIG. 2 (c), at time $t_2$, it becomes easy to create the second potential valley PW2 in the shape of the well-shaped potential distribution monotonously and continuously, and therefore, even if the quantity of the signal charges is large, electrons can overflow from the potential well created by the first MOS capacitor (31, 33, 25), and electrons can be accumulated in the potential valley created by the accumulation region 24 directly and smoothly. Hence, the signal charges can be protected from being left on the potential valley created by the charge-generation buried region 23. Also, it becomes easy to conduct the design in which the capacitance of the charge accumulation diode D2 is made large and the capacitance of the first MOS capacitor (31, 33, 25) is made small.

Second Embodiment

In the semiconductor element used in the solid-state imaging device pertaining to the first embodiment, the first MOS capacitor (31, 33, 25) is implemented by the capacitor-implement region 25 of the second conductivity type, which is arranged in a part below the transfer-gate electrode 31, through the gate insulation film (transfer-gate insulation film) 33, and the transfer-gate electrode 31. However, even if a common buried region 63 of the second conductivity type (n-type), which is lower in impurity concentration than the charge-generation buried region 23, is arranged on the entire surface below the transfer-gate electrode 31 in the upper portion of the base-body region 21 as illustrated in FIG. 11 (a), a recessed electronic-shuttering potential barrier can be created below the transfer-gate electrode 31.

Figure 11:
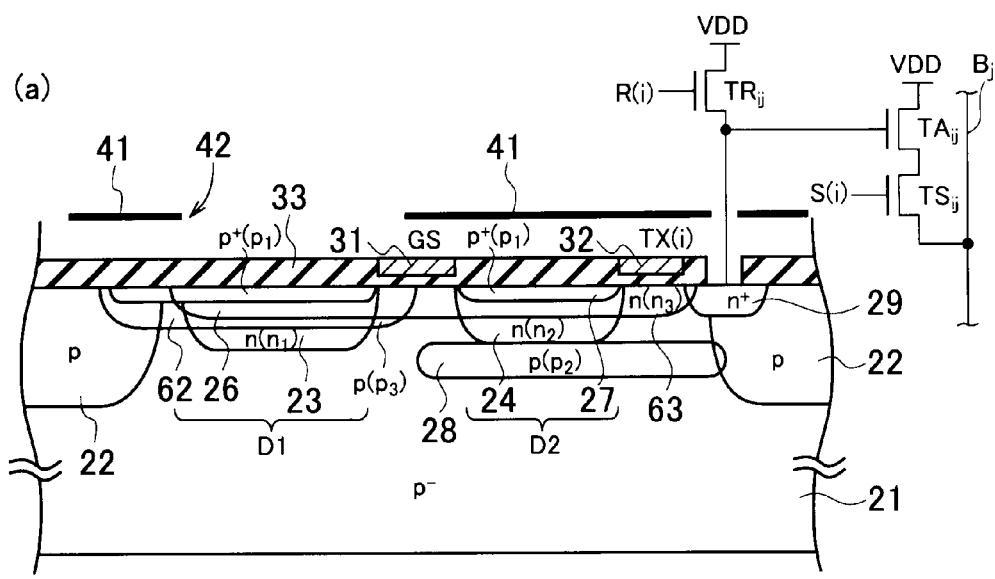
FIG. 11 (a) is a schematic cross-sectional view describing a configuration of a semiconductor element pertaining to a second embodiment.
Figure 11:
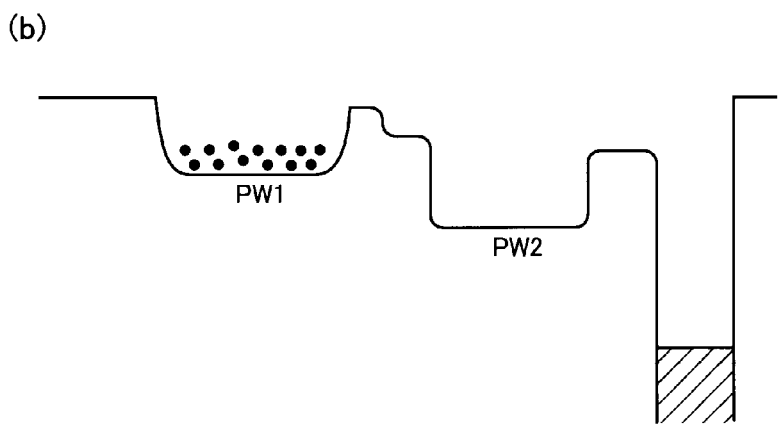

That is, in a semiconductor element used in a solid-state imaging device pertaining to a second embodiment, as illustrated in FIG. 11 (a), against to a common buried region 63 that spans from a site at the upper portion of the charge-generation buried region 23 to a site at the lower portion of the read-out-gate electrode 32 in the upper portion of the base-body region 21, a stepped-distribution creation region 62 of the first conductivity type (p-type) is provided. The stepped-distribution creation region 62 spans from a site at part of the well (p-well) 22 to a site at a part of the lower 3J portion of the transfer-gate electrode 31 including the upper portion of the charge-generation buried region 23, in the upper portion of the base-body region 21, and has a higher impurity concentration than the base-body region 21. Consequently, the common buried region 63 and the stepped-distribution creation region 62 implement "a recessed-potential creation means". Then, the recessed-potential creation means forms the recessed electronic-shuttering potential barrier below the transfer-gate electrode 31.

The common buried region 63 is arranged on the entire surface of the lower portion of the transfer-gate electrode 31. However, except the region occupied by the stepped-distribution creation region 62, the transfer-gate electrode 31, the gate insulation film (transfer-gate insulation film) 33 and the common buried region 63 implement a first MOS capacitor (31, 33, 63). Similarly, the common buried region 63 is arranged on the entire surface of the lower portion of the read-out-gate electrode 32. Then, the read-out-gate electrode 32, the gate insulation film (read-out gate insulation film) 33 and the common buried region 63 implement a second MOS capacitor (32, 33, 63). Because the other configuration is substantially similar to the configuration of the semiconductor element illustrated in FIG. 2 (a), the duplicate explanation of the other configuration is omitted.

In the semiconductor element pertaining to the second embodiment, the potential distribution similar to that of the first embodiment is accomplished, as illustrated in FIG. 11 (a). When the capacitance of the charge accumulation diode D2 is designed large, the capacitance of the first MOS capacitor (31, 33, 63) can be designed small. Also, in the explanation of the second embodiment, because a case is explained in which the first conductivity type is assigned as p-type and the second conductivity type is assigned as n-type, and the subject signal charges on which the electronic process such as transfer, accumulation is performed are assigned as electrons is explained, in the potential diagram illustrated in FIG. 11 (b), the lower direction (depth direction) of the drawing is assigned as the positive direction of potential.

Third Embodiment

The semiconductor element pertaining to the first embodiment has the potential difference between the first potential valley PW1 and the second potential valley PW2, which is caused by the difference of the impurity concentration between n-type semiconductors. However, it is possible to have the potential difference between the first potential valley PW1 and the second potential valley PW2, which is caused by the difference of the impurity concentration between the p-type semiconductors.

Figure 12:
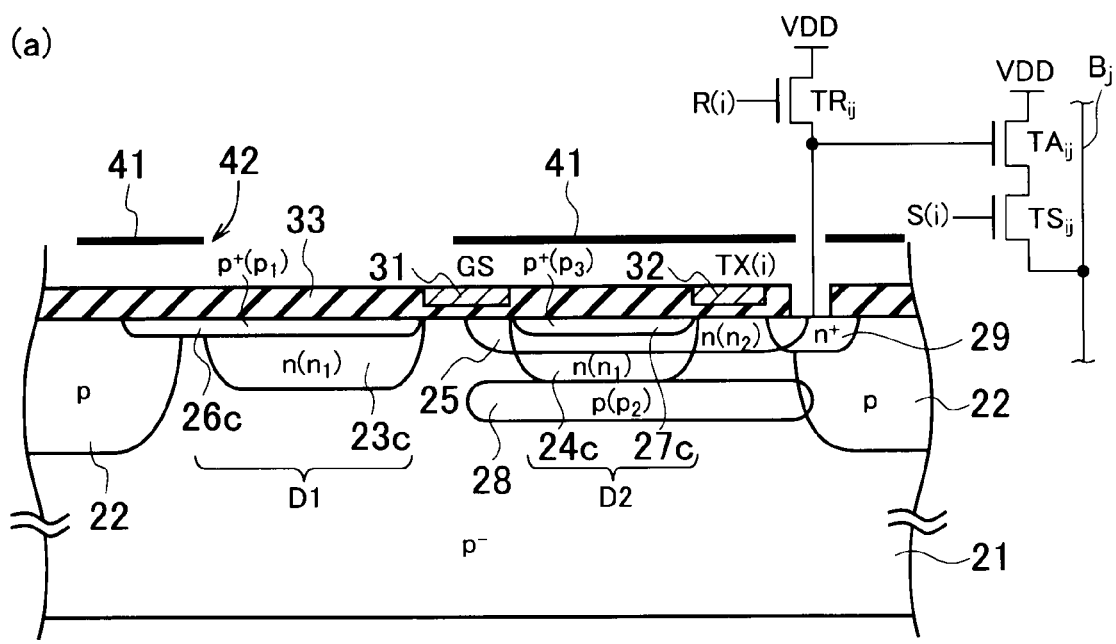
FIG. 12 (a) is a schematic cross-sectional view describing a configuration of a semiconductor element pertaining to a third embodiment.
Figure 12:
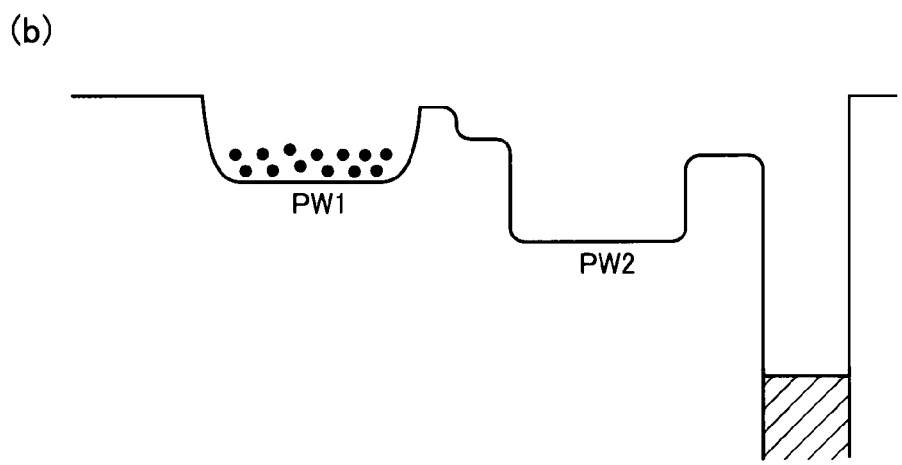

In a semiconductor element pertaining to a third embodiment, as illustrated in FIG. 12 (a), the base-body region 21 and the capacitor-implement region 25 implement the recessed-potential creation means. However, by setting the impurity concentration $p_1$ of the first pining layer 26 to be higher than an impurity concentration $p_3$ of the second pining layer 27, the potential distribution defined by the first potential valley PW1 and the second potential valley PW2 can be obtained, similarly to the profile of the first embodiment illustrated in FIG. 12 (b). In the third embodiment, because a charge-generation buried region 23c and an accumulation region 24c can be formed at the same impurity concentration ($n_1$), the ions can be implanted into the charge-generation buried region 23c and the accumulation region 24c by using the same mask.

Also, in the explanation of the third embodiment, because a case in which the first conductivity type is assigned as p-type and the second conductivity type is assigned as n-type, and the signal charges on which the processes such as transfer, accumulation or the like are executed are assigned as the electrons is explained, in the potential diagram illustrated in FIG. 12 (b), the lower direction (depth direction) of the drawing is represented as the positive direction of potential.

Fourth Embodiment

Figure 13:
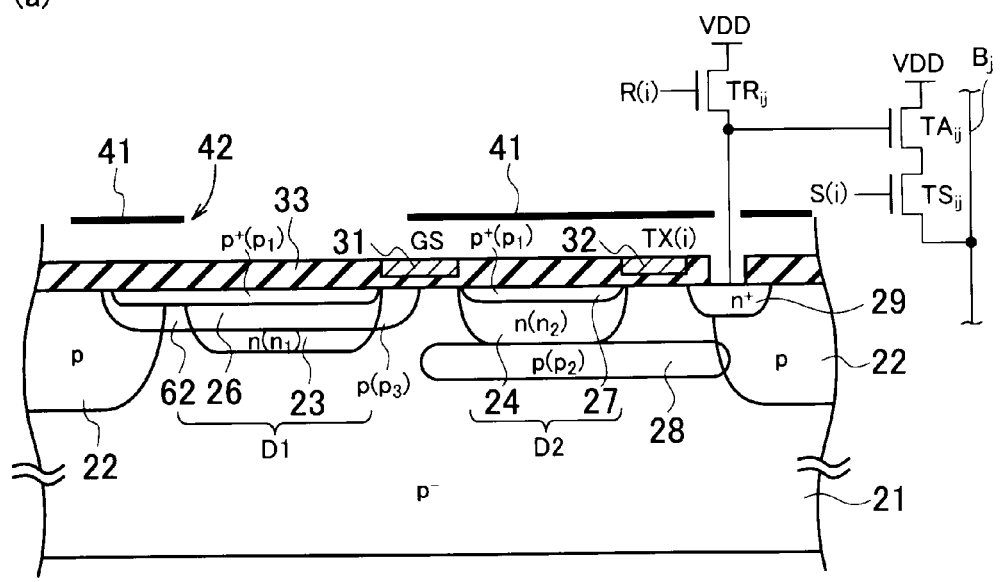
FIG. 13 (a) is a schematic cross-sectional view describing a configuration of a semiconductor element pertaining to a fourth embodiment.
Figure 13:
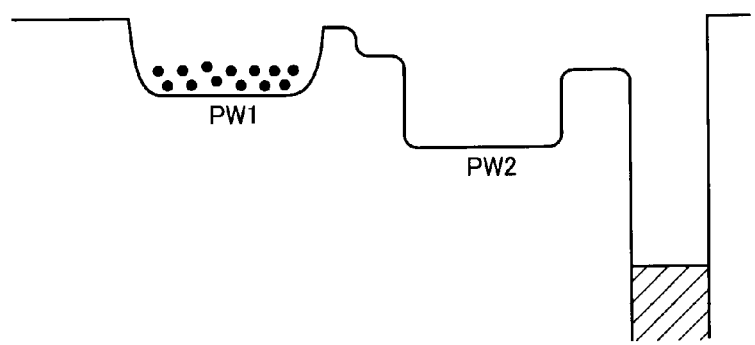

A semiconductor element pertaining to a fourth embodiment has a stair-like-shaped electronic-shuttering potential barrier defined by the top level and the shoulder level, as illustrated in FIG. 13 (b), similarly to the first embodiment, in which a structure illustrated in FIG. 13 (a) is employed, without any formation of the common buried region 63 of the second 3J conductivity type below the transfer-gate electrode 31 as illustrated in FIG. 11 (a).

In the explanation of the fourth embodiment, a case in which the first conductivity type is assigned as p-type and the second conductivity type is assigned as n-type, and the signal charges on which the processes such as transfer, accumulation or the like are executed are assigned as the electrons is explained, in the potential diagram illustrated in FIG. 13 (b), the lower direction (depth direction) of the drawing is represented as the positive direction of potential.

On the upper portion of the base-body region 21, a stepped-distribution creation region 62 of the first conductivity type that has a high impurity concentration $p_3$ as compared with the base-body region 21 spans from a site at a part of the well 22 to a site at a part of the lower portion of the transfer-gate electrode 31 including the upper portion of the charge-generation buried region 23. That is, the base-body region 21 and the stepped-distribution creation region 62 implement the recessed-potential creation means. By providing the stepped-distribution creation region 62, similarly to the first embodiment, the stair-like-shaped electronic-shuttering potential barrier can be established just under the transfer-gate electrode 31, which has the top level at the location of photodiode D1 and the shoulder level on the side of the charge accumulation diode D2. Consequently, charges once transferred to the accumulation region 24 are not adversely sent to the charge-generation buried region 23, and then, in the semiconductor element pertaining to the fourth embodiment, the perfect charge transfer can be facilitated easily, similarly to the semiconductor layer pertaining to the first embodiment illustrated in FIG. 2 (a).

The block layer 28 (having the impurity concentration $p_2$) below the accumulation region 24 may be formed by conducting ion implantation through self-alignment methodology, while the transfer-gate electrode 31 and the read-out-gate electrode 32 are used as the masks, after the formation of the transfer-gate electrode 31 and the read-out-gate electrode 32. In this way, when the block layer 28 is formed through self-alignment methodology, the number of the masks used in ion implantation can be decreased, which can reduce the manufacturing cost of the semiconductor element. Moreover, the number of the masks can be decreased by using the same mask as the mask for the accumulation region 24 for selectively implanting ions into the block layer 28, by adjusting the implantation conditions. Also, it is possible to protect the occurrence of the transfer failure, in which the mask-alignment displacement causes the potential distribution to be changed from the intended distribution by design, and it is possible to improve the manufacture yield.

Fifth Embodiment

Because the entire configuration of a solid-state imaging device (two-dimensional image sensor) pertaining to a fifth embodiment of the present invention is equivalent to the block diagram illustrated in FIG. 1, the duplicate explanations are omitted. In the solid-state imaging device pertaining to the fifth embodiment, a structure is explained in which as a countermeasure against a case that a very bright light is irradiated, an overflow-buried region 60 and an extraction region 20 are provided as component for the structure of the semiconductor element in each of pixels $X_{11}$ to $X_{1m}$; $X_{21}$ to $X_{2m}$; - - - ; and $X_{n1}$ to $X_{nm}$, as illustrated in FIG. 7 (a).

Figure 7:
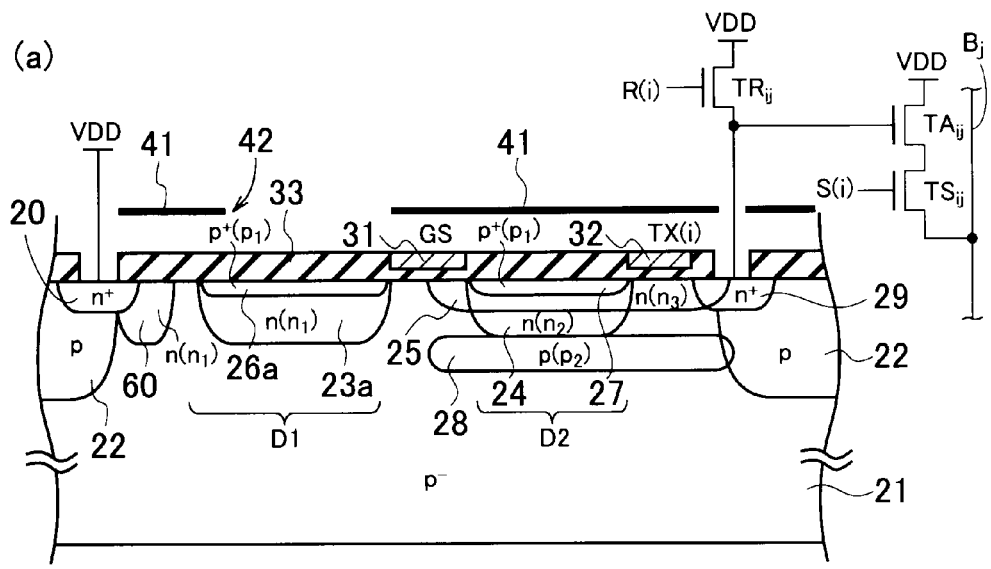
FIG. 7 (a) is a schematic cross-sectional view describing a configuration of a semiconductor element that serves as a part of pixels in a solid-state imaging device pertaining to a fifth embodiment of the present invention.
Figure 7:
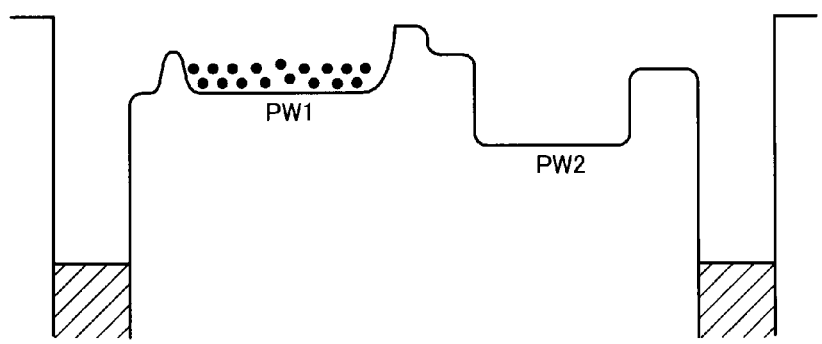

As illustrated in FIG. 7 (a), the overflow-buried region 60 is buried in the upper portion of the base-body region 21, being separated from a charge-generation buried region 23a and located adjacently to the extraction region 20. FIG. 7 (b) is the potential diagram on a cross-sectional plane by which the extraction region 20, the overflow-buried region 60, the charge-generation buried region 23a, the accumulation region 24 and the read-out region 29 are cut in view of FIG. 7 (a). An overflow-potential barrier, in which the height of potential barrier against electrons is low, is created between the first potential valley PW1 and the overflow-buried region 60. In the semiconductor element used in the solid-state imaging device pertaining to the fifth embodiment, as illustrated in FIG. 7 (b), when the generated signal charges become excessive, because the excess-signal charges can be made overflow through the overflow-potential barrier in which the height of the barrier against electrons is low and extract to the extraction region 20, the structure illustrated in FIG. 7 (b) is effective for suppressing blooming. The height of potential barrier for reading out, which is located between the second potential valley PW2 and the potential well of the read-out region 29, is changed by voltages of the control signal TX applied to the read-out-gate electrode 32.

In the explanation of the fifth embodiment, because a case in which the first conductivity type is assigned as p-type, the second conductivity type is assigned as n-type, and the signal charges on which the processes such as transfer, accumulation or the like are performed are assigned as electrons is exemplarily described, in the potential diagram illustrated in FIG. 7 (b), the lower direction (depth direction) of the drawing is represented as the positive direction of potential.

In an area of the accumulation region 24 below the transfer-gate electrode 31, the capacitor-implement region 25 of the second conductivity type is arranged in the upper portion of the base-body region 21, and the base-body region 21 and the capacitor-implement region 25 implement the recessed-potential creation means. An area at a portion where the transfer-gate electrode 31 is facing to the capacitor-implement region 25 and the capacitor-implement region 25 implement a parallel plate structure through a gate insulation film (transfer-gate insulation film) 33, and the parallel plate structure implements a first MOS capacitor (31, 33, 25). Because the capacitor-implement region 25 spans from a site of the first MOS capacitor (31, 33, 25) to a site at the upper portion of the base-body region 21 located below the read-out-gate electrode 32, the read-out-gate electrode 32, the gate insulation film (read-out gate insulation film) 33 and the capacitor-implement region 25 implement a second MOS capacitor (32, 33, 25), similarly to the first MOS capacitor (31, 33, 25). In the stair-like-shaped electronic-shuttering potential barrier between the first potential valley PW1 and the second potential valley PW2, the height of top level is changed by voltages of the control signal GS applied to the transfer-gate electrode 31, while the step-level relation between the top level and the shoulder level is qualitatively kept. Because the other cross-sectional structure of the semiconductor element illustrated in FIG. 7 is basically similar to the structure illustrated in FIG. 2 (a), the duplicate explanation of the other configuration is omitted.

In the solid-state imaging device pertaining to the fifth embodiment, on the basis of the control signal GS applied to the transfer-gate electrode 31, because the stair-like-shaped electronic-shuttering potential barrier is formed below the transfer-gate electrode 31, while the step-level relation between the top level and the shoulder level is kept, the height of top level is changed, and consequently, even if the potential difference between the first potential valley PW1 and the second potential valley PW2 deeper than the first potential valley PW1 is small, the perfect transfer of charges can be achieved, which can store the sufficient number of the accumulation electrons.

Sixth Embodiment

Figure 8:
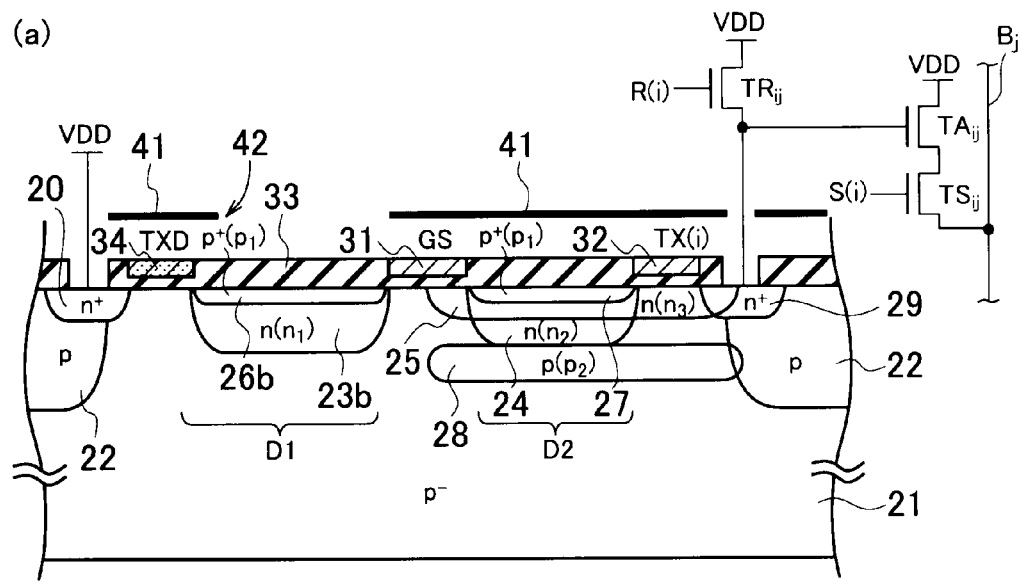
FIG. 8 (a) is a schematic cross-sectional view describing a configuration of a semiconductor element that serves as a part of pixels in a solid-state imaging device pertaining to a sixth embodiment of the present invention.
Figure 8:
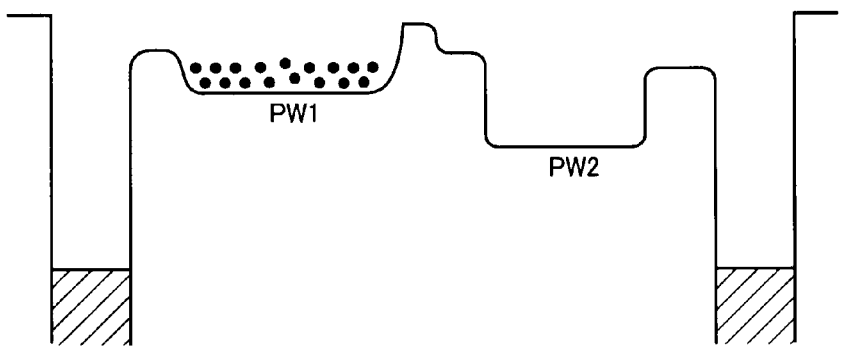
Figure 8:
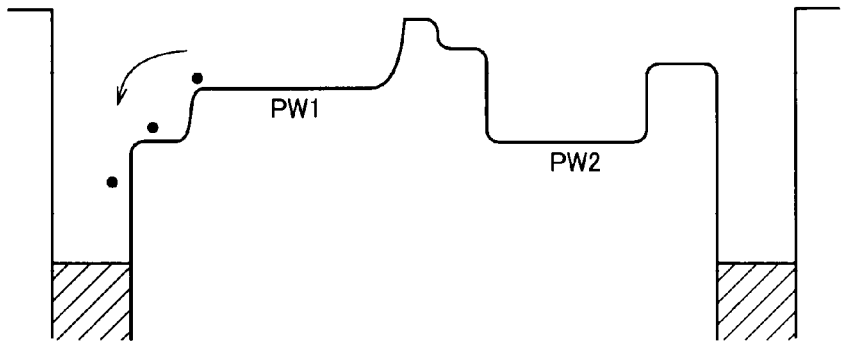

FIG. 8 (a) illustrates a cross-sectional structure of a semiconductor element, being assigned in each of pixels $X_{11}$ to $X_{1m}$; $X_{21}$ to $X_{2m}$; - - - ; and $X_{n1}$ to $X_{nm}$, which are arrayed in a solid-state imaging device pertaining to a sixth embodiment. As illustrated in FIG. 8 (a), the semiconductor element pertaining to the sixth embodiment differs from the first embodiment by a F feature such that the semiconductor element encompasses an extraction region 20 provided in the upper portion of the base-body region 21 separately from the charge-generation buried region 23b, and an extraction-gate electrode 34 provided on the gate insulation film (extraction-gate insulation film) 33 above a site between the charge-generation buried region 23b and the extraction region 20.

In FIG. 8 (a), the extraction-gate electrode 34 carries out the function of electronic shuttering, which controls the potential of the transfer channel formed between the charge-generation buried region 23b and the extraction region 20 and extracts the signal charges from the charge-generation buried region 23 to the extraction region 20.

In an area of the accumulation region 24 below the transfer-gate electrode 31, the capacitor-implement region 25 of the second conductivity type is arranged in the upper portion of the base-body region 21, and therefore, the base-body region 21 and the capacitor-implement region 25 implement the recessed-potential creation means. An area where the transfer-gate electrode 31 is facing to the capacitor-implement region 25 and the capacitor-implement region 25 implement a parallel plate structure through the gate insulation film (transfer-gate insulation film) 33, and the parallel plate structure implements a first MOS capacitor (31, 33, 25). Because the capacitor-implement region 25 spans from a site of the first MOS capacitor (31, 33, 25) to the upper portion of the base-body region 21 located below the read-out-gate electrode 32, the read-out-gate electrode 32, the gate insulation film (read-out gate insulation film) 33 and the capacitor-implement region 25 implement a second MOS capacitor (32, 33, 25), similarly to the first MOS capacitor (31, 33, 25). Because the other cross-sectional structure is substantially similar to the semiconductor element illustrated in FIG. 2 (a), the duplicate explanation of the other configuration is omitted.

FIGS. 8 (b) and 8 (c) are the potential diagrams on a cross-section in which the extraction region 20, the charge-generation buried region 23b, the accumulation region 24 and the read-out region 29 are cut by the horizontal plane taken on FIG. 8 (a). The stair-like-shaped electronic-shuttering potential barrier is created between the first potential valley PW1 and the second potential valley PW2. Then, by applying a voltage of the control signal GS to the transfer-gate electrode 31, the height of the top level of potential barrier against electrons is changed while the step-level relation between the top level and the shoulder level is qualitatively kept. A extraction potential barrier is created between the first potential valley PW1 and the second potential valley PW2. Voltages are applied to the extraction-gate electrode 34 as the control signal TXD, and the voltages change the height of potential barrier against electrons in the extraction-potential barrier. As illustrated in FIG. 8 (c), when the positive voltage as the control signal TXD is applied to the extraction-gate electrode 34, it is possible to carry out an operation for lowering the height of potential barrier against electrons in the extraction-potential barrier so as to extract charges from the charge-generation buried region 23b to the extraction region 20, and then, controlling a shuttering time. The height of potential barrier for reading out, which is located between the second potential valley PW2 and the potential well of the read-out region 29, is changed by the control signal TX applied to the read-out-gate electrode 32.

In the explanation of the sixth embodiment, because a case in which the first conductivity type is assigned as p-type, the second conductivity type is assigned as n-type, and the signal charges on which the processes such as transfer, accumulation or the like are performed are assigned as electrons is exemplarily described, in the potential diagrams illustrated in FIGS. 8 (b) and 8 (c), the lower direction (depth direction) of the drawing is represented as the positive direction of potential.

In the first to fifth embodiments, a shuttering time $T_{SH}$ is a time from a fall time of the control signal GS to a rise time of next-applied control signal GS. However, in the solid-state imaging device pertaining to the sixth embodiment, because the semiconductor element has an initializing function of photodiode D1, and the flow direction of the signal charges can be controlled by the extraction-gate electrode 34 and the transfer-gate electrode 31, by changing the timing of pulse of the control signal TXD applied to the extraction-gate electrode 34, it is possible to control the shuttering time $T_{SH}$. Also, in the semiconductor element pertaining to the sixth embodiment, similarly to the first to fifth embodiments, the direction of field toward which the signal charges generated by the photodiode move is assumed to be the depth direction, and because the stair-like-shaped electronic-shuttering potential barrier is created between the first potential valley PW1 and the second potential valley PW2 deeper than the first potential valley PW1, while the step-level relation between the top level and the shoulder level is qualitatively kept, the height of the top level of potential barrier against electrons is changed, which can achieve the perfect transfer of electrons.

Figure 9:
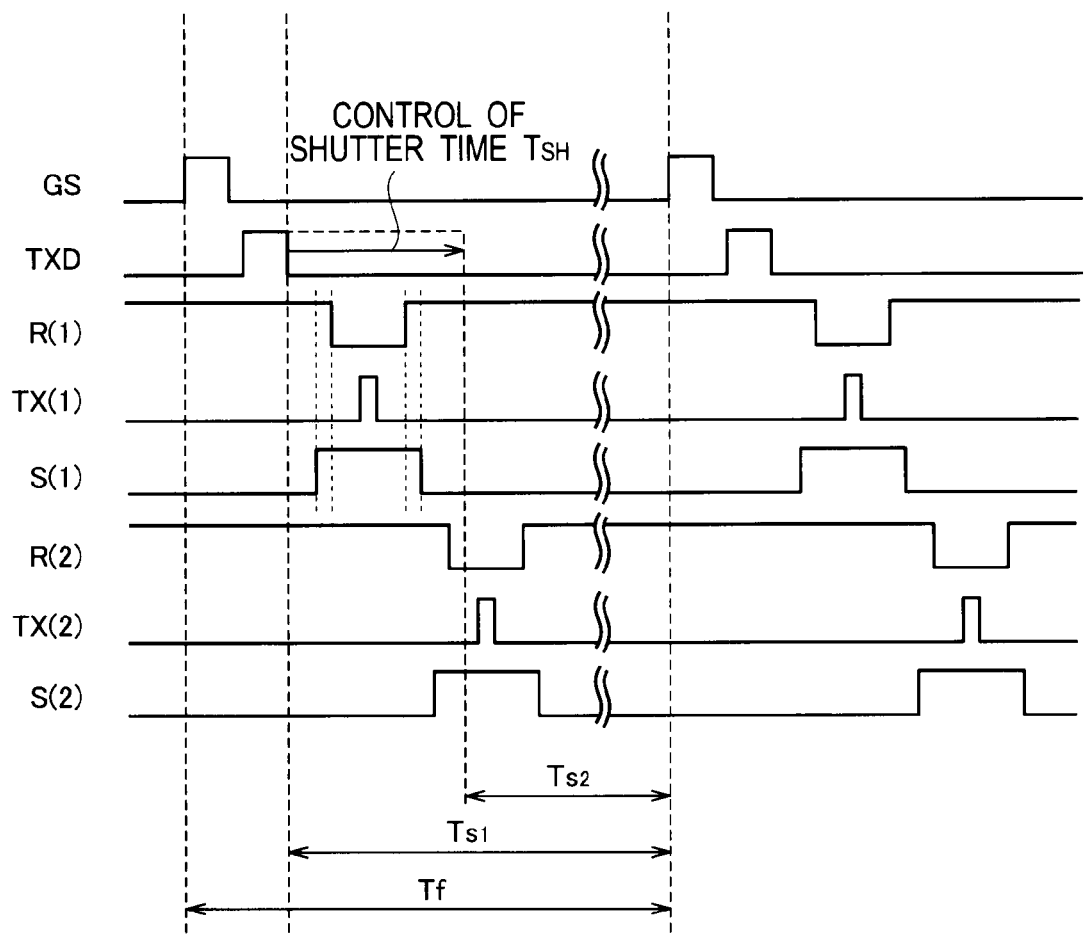
FIG. 9 is a timing chart describing a method that controls a shuttering time in the solid-state imaging device pertaining to the sixth embodiment of the present invention.

For example, as illustrated in FIG. 9, by changing the timing of the control signal TDX, the shuttering time $T_{SH}$ can be changed, or the accumulation time can be changed from $T_{S1}$ to $T_{S2}$, the accumulation time is defined between the fall time of the control signal TXD and a next rise time of the control signal GS, Between the shuttering time $T_{SH}=T_{S2}$, charges are accumulated in the charge-generation buried regions 23 of all of pixels $X_{11}$ to $X_{1m}$; $X_{21}$ to $X_{2m}$; - - -; and $X_{n1}$ to $X_{nm}$, and then, all of the charges accumulated in the charge-generation buried regions 23 are transferred to the accumulation region 24 in a next frame period $T_f$, because the control signal GS is applied to all of pixels simultaneously. Charges accumulated in the accumulation region 24 are read out in turn from the pixels $X_{11}$ to $X_{1m}$ on the first row, sequentially.

As illustrated in FIG. 9, in the reading-out operation, at first, control signal S(1) for selecting a horizontal line is applied from the vertical shift register 3, and when the control signal S(1) for selecting is set to high (H) level, a switching transistor $TS_{ij}$ is turned on, and a current, which is amplified by a signal-read-out transistor (amplifying transistor) $TA_{ij}$ and corresponds to the potential of the read-out region 29, flows through a vertical signal line $B_j$. At this time, since the reset signal R(i) is set at high (H) level, charges accumulated in the read-out region 29 are extracted, and the read-out region 29 is reset. Next, the control signal TX is applied to the read-out-gate electrode 32, and charges accumulated in the accumulation region 24 are transferred to the read-out region 29. Charges transferred to the read-out region 29 are read out from the vertical signal line through the read-out-buffer amplifier. These operations are repeated until the n-th row completes.

<Simulation>

Figure 10:
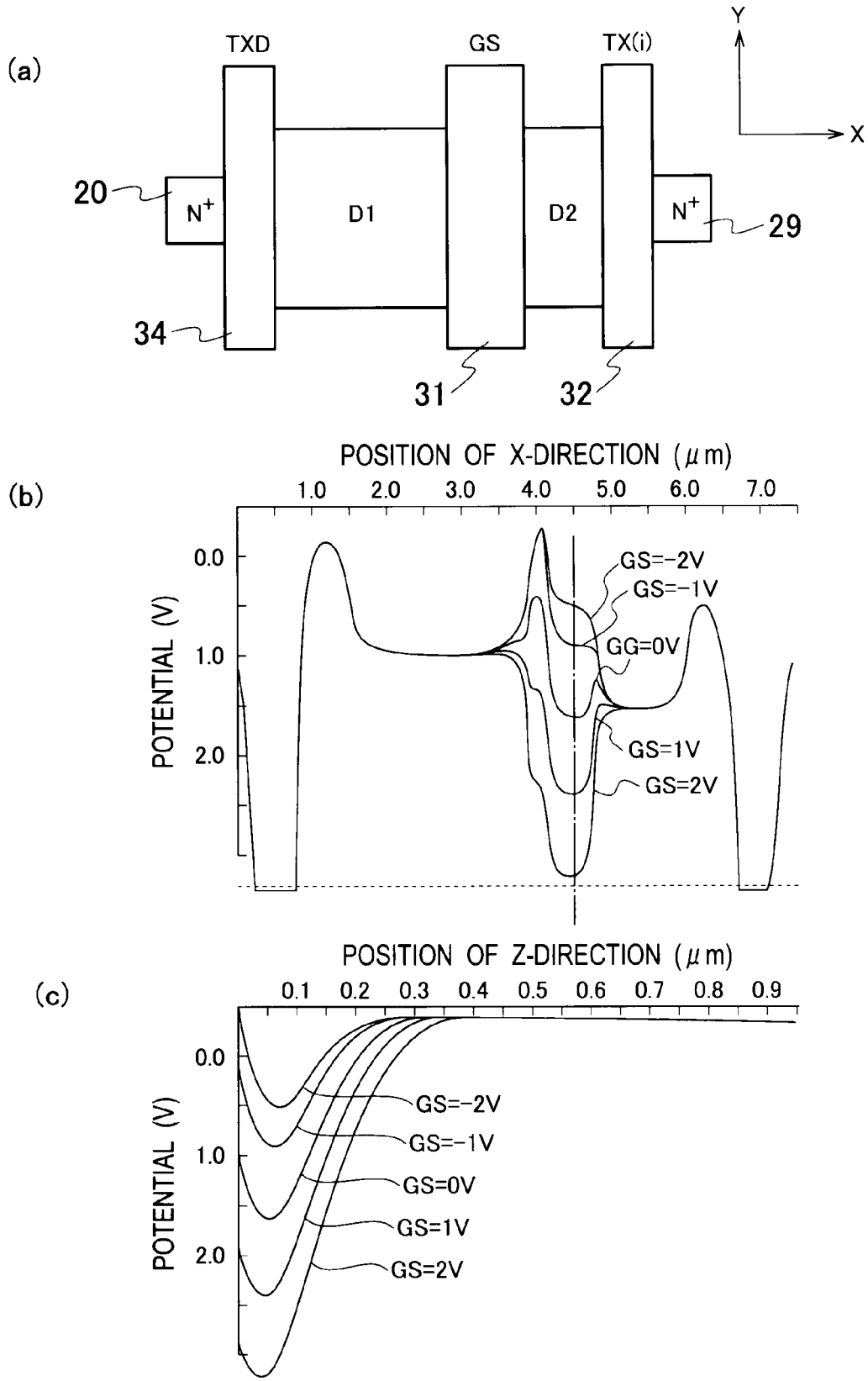
FIG. 10 (a) illustrates one example of plan view of the semiconductor element illustrated in FIG. 8 (a).

FIG. 10 (a) illustrates one example of planar structure of the semiconductor element in the sixth embodiment in which the cross-sectional view is illustrated in FIG. 8 (a). In FIG. 10 (b), the potential distributions along a horizontal direction (x-direction) are plotted, the potential distributions are plotted with parameters of the control signals GS applied to the transfer-gate electrode 31, calculated by simulation with the semiconductor element illustrated in FIGS. 8 (a) and 10 (a) as the simulation model.

As illustrated in FIG. 10 (b), between the first potential valley PW1 created by the photodiode D1 and the second potential valley PW2 created by the charge accumulation diode D2, stair-like-shaped electronic-shuttering potential barriers can be observed to be created in a portion (the position in an X-direction is about 3.5 to 5.0 micrometers) corresponding to the first potential control means (31, 33), at GS=-2 V. In the stair-like-shaped electronic-shuttering potential barriers, the height of the top levels of potential barriers against electrons can be affirmed to be changed by voltages of the control signals GS=-2 V, -1 V, 0 V, 1 V or 2 V that are applied to the transfer-gate electrode 31, while the step-level relation between the top level and the shoulder level is qualitatively kept. When the control signal is set to GS=-1 V, the potential at a location corresponding to the first MOS capacitor (31, 33, 25) is increased by about 0.4 V. When the control signal is set to ground potential GC=0 V, the stair-like-shaped electronic-shuttering potential barrier is decreased while having a recess. When the control signal is set to GS=1 V, the electronic-shuttering potential barrier is perfectly extinguished, and with regard to the potential distribution of the location corresponding to the first potential control means (31, 33), the heights of potential barriers against electrons are decreased at an order of GS=1 V, 2 V, while the step-level relation between the top level and the shoulder level is qualitatively kept. An extraction-potential barrier can be affirmed to be established between the first potential valley PW1 created by the photodiode D1 and the extraction region 20 on its left side. The height of extraction-potential barrier is changed by the voltages as the control signal TXD applied to the extraction-gate electrode 34. The potential barrier for reading out can be affirmed to be established between the second potential valley PW2 created by the charge accumulation diode D2 and the potential well of the read-out region 29. The height of potential barrier for reading out is changed by voltages of the control signal TX applied to the read-out-gate electrode 32.

FIG. 10 (c) illustrates the potential distribution of the depth direction (in FIG. 10 (a), the rearward direction of the paper is assigned as Z-direction) of the first MOS capacitor (31, 33, 25), at a position indicated by dash-dotted line in FIG. 10 (b). From FIG. 10 (c), interface states can be understood to be in a pinned state. Even at control signal GS=2 V, at timing when charges are scheduled to be transferred, the maximum potential lies at a level deeper than the interface state, because the direction of field toward which electrons as the signal charges move is defined as the depth direction, and the first MOS capacitor (31, 33, 25) can be understood to serve as the buried MOS capacitor. Because the saturation charge concentration of the buried MOS capacitor in the simulation is about 300 $e^-/micrometer^2$ when the control signal GS=2 V, a sufficiently large saturation charge quantity can be obtained against surface traps. By the way, the saturation 3J charge concentration can be increased up to about one digit by adjusting the impurity concentration and the like.

The Other Embodiments

As mentioned above, the present invention has been described by using the first to sixth embodiments. However, the discussions and drawings that implement a part of present disclosure should not be understood to limit the present invention. From the present disclosure, various modifications, implementations and operational techniques would be evident for one skilled in the art.

In the explanation of the first to sixth embodiments as mentioned already, although these embodiments are explained under the assumption that the first conductivity type is p-type and the second conductivity type is n-type, even under an assumption that the first conductivity type is n-type and the second conductivity type is p-type, the subject matter such that the similar effectiveness can be achieved, when the electrical polarities are made opposite, may be easily understood. In the explanation of the first to sixth embodiments, because the signal charges on which the processes such as transfer, accumulation or the like is performed are assumed to be electrons, and in the potential diagram, the lower direction (depth direction) of the drawing is assigned to be the positive direction of potential. However, in a case that the electrical polarity is opposite, and the under processed charges are assigned as holes, in the representation of the potential shape, which indicates the potential barrier, the potential valley, the potential well and the like inside the semiconductor element, the lower direction (depth direction) of the drawing shall be assigned to be the negative direction of potential.

Also, in the explanation of the first to sixth embodiments as mentioned already, the two-dimensional solid-state imaging device (area sensor) has been exemplarily explained. However, it should not be limitedly construed that the semiconductor element of the present invention is used only in the pixel in the two-dimensional solid-state imaging device. For example, in the configuration of the two-dimensional matrix illustrated in FIG. 1, if we set j=m=1, a plurality of semiconductor elements may be one-dimensionally arrayed so as to implement a one-dimensional solid-state imaging device (line sensor), would be easily understood from the content of the above disclosure.

In this way, the present invention inherently includes various embodiments that are not described herein. Thus, the technical scope of the present invention should be determined only by the subject-matter-to-define-the-invention according to the disclosure of claims, which are reasonable from the above descriptions.

INDUSTRIAL APPLICABILITY

According to the present invention, because the charge transfer without any leakage can be achieved, the present invention can be applied in the technical field such as super high-speed cameras and range image sensors of low noise. In particular, it is expected that the present invention can be applied in technical fields of fluorescence-detection biosensors, whose demand will increase in future.

REFERENCE SIGNS LIST $CDS_1$ to $CDS_m$ Correlated Double Sampling (Noise Canceling Circuit)
D1 Photodiode
D2 Charge Accumulation Diode
$X_{11}$ to $X_{1m}$; $X_{21}$ to $X_{2m}$; ... ; $X_{n1}$ to $X_{nm}$ Pixel
1 Pixel array
2 Horizontal Shift Register
3 Vertical Shift Register
4 Timing Generator
5 Signal Processor
6 Amplifier
20 Extraction region
21 Base-body Region
22 Well
23, 23a, 23b, 23c Charge-Generation Buried Region
23p Charge-Generation Buried Region Scheduled Area
24, 24c Accumulation region
25, 61 Capacitor-implement Region
25p Capacitor-implement Region Scheduled Area
26 First Pinning Layer
26p First Pinning Layer Scheduled Area
27 Second Pining Layer
27p Second Pining Scheduled Area
28 Block Layer
29 Reading-out region
31 Transfer-Gate Electrode
32 Read-out Gate Electrode
33, 71 Gate Insulation Film
34 Extraction-Gate Electrode
35 Spacer
41 Light Shielding Film
42 Opening
51, 52, 53, 54 Photoresist Film
60 Overflow-Buried Region
61 Capacitor-Implement Region
62 Stepped-Distribution Creation Region
63 Common Buried Region

The invention claimed is:
1. A semiconductor element comprising:
a base-body region implemented by a semiconductor of a first conductivity type;
a charge-generation buried region of a second conductivity type, being buried in a part of an upper portion of the base-body region so as to implement a photodiode together with the base-body region, configured to create a first potential valley in the base-body region;
an accumulation region of the second conductivity type, being buried in a part of the upper portion of the base-body region, separately from the charge-generation buried region, configured to create a second potential valley deeper than the first potential valley, where direction of field toward which signal charges generated by the photodiode move is defined as depth direction;
a transfer-gate insulation film provided on a surface of the base-body region between the charge-generation buried region and the accumulation region;
a transfer-gate electrode provided on the transfer-gate insulation film, configured to control a potential of a transfer channel formed in the base-body region between the charge-generation buried region and the accumulation region; and
a recessed-potential creation means configured to create a stair-like-shaped potential barrier for electronic shuttering, the stair-like-shaped potential barrier has a shoulder level at a side of the second potential valley, the shoulder level is lower by one stage in a potential barrier reduction direction than top level of the first potential valley, between the first potential valley and the second potential valley;
a read-out region of the second conductivity time, being buried in a part of the upper portion of the base-body region, separately from the accumulation region, configured to receive signal charges transferred from the accumulation region, and to store the transferred signal charges until at a time of reading out;
a read-out gate insulation film provided on a surface of the base-body region between the accumulation region and the read-out region; and
a read-out-gate electrode provided on the read-out gate insulation film, configured to control a potential of a read-out channel formed in the base-body region between the accumulation region and the read-out region,
wherein, while a qualitative level relation between the top level and the shoulder level is kept, a height of the top level of electronic-shuttering potential barrier is changed by voltages applied to the transfer-gate electrode so that a height of the shoulder level is lower than a bottom of the second potential valley when the signal charges are transferred from the charge-generation buried region to the accumulation region, and so that the height of the shoulder level becomes higher than the bottom of the second potential valley just before the signal charges are transferred from the accumulation region to the read-out region.

2. The semiconductor element of claim 1, wherein the recessed-potential creation means comprises a capacitor-implement region of the second conductivity type, having a lower impurity concentration than the accumulation region, the capacitor-implement region occupies an area of the upper portion of the base-body region implementing the transfer channel and another area of the upper portion of the base-body region implementing the transfer channel, the another area overlaps with the accumulation region.

3. The semiconductor element of claim 1, wherein the recessed-potential creation means comprises a capacitor-implement region of the second conductivity type, having a higher impurity concentration than the accumulation region, the capacitor-implement region occupies an area of the upper portion of the base-body region implementing the transfer channel and another area of the upper portion of the base-body region implementing the transfer channel, the another area overlaps with the accumulation region.

4. The semiconductor element of claim 1, wherein the recessed-potential creation means comprises:
a common buried region of the second conductivity type having a lower impurity concentration than the accumulation region, the common buried region has an area extending in the upper portion of the base-body region including the transfer channel, the area of the common buried region includes the accumulation region and the charge-generation buried region, and
a stepped-distribution creation region of the first conductivity type, which occupies a part of the common buried region and overlaps with the charge-generation buried region, having a higher impurity concentration than the base-body region.

5. The semiconductor element of claim 1, further comprising:
an extraction region of the second conductivity type, being buried in a part of the upper portion of the base-body region, separately from the charge-generation buried region;
an extraction-gate insulation film provided on a surface of the base-body region between the charge-generation buried region and the extraction region; and
an extraction-gate electrode provided on the extraction-gate insulation film, configured to control a potential of an extraction channel formed in the base-body region between the charge-generation buried region and the extraction region.

6. The semiconductor element of claim 1, further comprising:
an overflow-buried region of the second conductivity type, being buried in a part of the upper portion of the base-body region, separately from the charge-generation buried region; and
an extraction region of the second conductivity type, being buried in a part of the upper portion of the base-body region, adjacently to the overflow-buried region.

7. The semiconductor element of claim 1, further comprising a block layer of the first conductivity type below the accumulation region, the block layer having a higher impurity concentration than the base-body region.

8. A solid-state imaging device comprising a plurality of pixels being arrayed, each of the pixels comprising:
a base-body region implemented by a semiconductor of a first conductivity type;
a charge-generation buried region of a second conductivity type, being buried in a part of an upper portion of the base-body region so as to implement a photodiode together with the base-body region, configured to create a first potential valley in the base-body region;
an accumulation region of the second conductivity type, being buried in a part of the upper portion of the base-body region, separately from the charge-generation buried region, configured to create a second potential valley deeper than the first potential valley, where direction of field toward which signal charges generated by the photodiode move is defined as depth direction;
a transfer-gate insulation film provided on a surface of the base-body region between the charge-generation buried region and the accumulation region;
a transfer-gate electrode provided on the transfer-gate insulation film, configured to control a potential of a transfer channel formed in the base-body region between the charge-generation buried region and the accumulation region; and
a recessed-potential creation means configured to create a stair-like-shaped potential barrier for electronic shuttering, the stair-like-shaped potential barrier has a shoulder level at a side of the second potential valley, the shoulder level is lower by one stage in a potential barrier reduction direction than top level of the first potential valley, between the first potential valley and the second potential valley;
a read-out region of the second conductivity time, being buried in a part of the upper portion of the base-body region, separately from the accumulation region, configured to receive signal charges transferred from the accumulation region, and to store the transferred signal charges until at a time of reading out;
a read-out gate insulation film provided on a surface of the base-body region between the accumulation region and the read-out region; and
a read-out-gate electrode provided on the read-out gate insulation film, configured to control a potential of a read-out channel formed in the base-body region between the accumulation region and the read-out region,
wherein, by applying simultaneously a voltage to the transfer-gate electrodes in each of pixels, keeping a qualitative level relation between the top level and the shoulder level, a height of the top level of electronic-shuttering potential barrier is changed by voltages applied to the transfer-gate electrode in each of pixels so that a height of the shoulder level is lower than a bottom of the second potential valley when the signal charges are transferred respectively from the charge-generation buried region to the accumulation region in each of pixels so as to execute global electronic shuttering, and so that the height of the shoulder level becomes higher than the bottom of the second potential valley just before the signal charges are transferred from the accumulation region to the read-out region.

9. The solid-state imaging device of claim 8, wherein the recessed-potential creation means comprises a capacitor-implement region of the second conductivity type, having a lower impurity concentration than the accumulation region, the capacitor-implement region occupies an area of the upper portion of the base-body region implementing the transfer channel and another area of the upper portion of the base-body region implementing the transfer channel an, the another area overlaps with the accumulation region.

10. The solid-state imaging device of claim 8, wherein the recessed-potential creation means comprises a capacitor-implement region of the second conductivity type, having a higher impurity concentration than the accumulation region, the capacitor-implement region occupies an area of the upper portion of the base-body region implementing the transfer channel and another area of the upper portion of the base-body region implementing the transfer channel an, the another area overlaps with the accumulation region.

11. The solid-state imaging device of claim 8, wherein the recessed-potential creation means comprises:
a common buried region of the second conductivity type having a lower impurity concentration than the accumulation region, the common buried region has an area extending in the upper portion of the base-body region including the transfer channel, the area of the common buried region includes the accumulation region and the charge-generation buried region, and
a stepped-distribution creation region of the first conductivity type, which occupies a part of the common buried region and overlaps with the charge-generation buried region, having a higher impurity concentration than the base-body region.

12. The solid-state imaging device of claim 8, wherein each of the pixels further comprises:
   an extraction region of the second conductivity type, being buried in a part of the upper portion of the base-body region, separately from the charge-generation buried region;
   an extraction-gate insulation film provided on a surface of the base-body region between the charge-generation buried region and the extraction region; and
   an extraction-gate electrode provided on the extraction-gate insulation film, configured to control a potential of an extraction channel formed in the base-body region between the charge-generation buried region and the extraction region.

13. The solid-state imaging device of claim 8, wherein each of the pixels further comprises:
   an overflow-buried region of the second conductivity type, being buried in a part of the upper portion of the base-body region, separately from the charge-generation buried region; and
   an extraction region of the second conductivity type, being buried in a part of the upper portion of the base-body region, adjacently to the overflow-buried region.

14. The solid-state imaging device of claim 8, wherein each of the pixels further comprises a block layer of the first conductivity type below the accumulation region, the block layer having a higher impurity concentration than the base-body region.

* * * * *